(12) United States Patent
Shen et al.

(10) Patent No.: US 7,960,214 B2
(45) Date of Patent: Jun. 14, 2011

(54) CHIP PACKAGE

(75) Inventors: Geng-Shin Shen, Tainan County (TW); David Wei Wang, Tainan County (TW)

(73) Assignees: ChipMOS Technologies Inc., Hsinchu (TW); ChipMOS Technologies (Bermuda) Ltd., Hamilton (BM)

(*) Notice: Subject to any disclaimer, the term of this patent is extended or adjusted under 35 U.S.C. 154(b) by 101 days.

(21) Appl. No.: 12/169,132

(22) Filed: Jul. 8, 2008

(65) Prior Publication Data

US 2008/0268572 A1    Oct. 30, 2008

Related U.S. Application Data

(60) Continuation-in-part of application No. 11/361,646, filed on Feb. 24, 2006, now abandoned, which is a division of application No. 11/234,774, filed on Sep. 22, 2005, now abandoned.

(51) Int. Cl.
 *H01L 21/44* (2006.01)
(52) U.S. Cl. .................. 438/118; 257/E21.503
(58) Field of Classification Search .................. 438/118; 257/E21.503
See application file for complete search history.

(56) References Cited

U.S. PATENT DOCUMENTS

| | | | |
|---|---|---|---|
| 6,022,761 A * | 2/2000 | Grupen-Shemansky et al. | 438/125 |
| 6,168,972 B1 | 1/2001 | Wang et al. | |
| 6,189,208 B1 | 2/2001 | Estes et al. | 29/840 |
| 6,252,301 B1 | 6/2001 | Gillen et al. | 257/690 |
| 6,388,313 B1 | 5/2002 | Lee et al. | |
| 6,410,415 B1 * | 6/2002 | Estes et al. | 438/612 |
| 2001/0051392 A1 | 12/2001 | Akram | 438/106 |
| 2006/0030071 A1 * | 2/2006 | Mizukoshi et al. | 438/106 |
| 2007/0148817 A1 | 6/2007 | Williams et al. | 438/106 |

FOREIGN PATENT DOCUMENTS

CN    1956179    5/2007

OTHER PUBLICATIONS

Chinese First Examination Report of China Application No. 2005101172129, dated on Jan. 4, 2008.
Chinese First Examination Report of China Patent Application No. 200810214686.9, dated Apr. 16, 2010.

* cited by examiner

*Primary Examiner* — Charles D Garber
*Assistant Examiner* — Stanetta D Isaac
(74) *Attorney, Agent, or Firm* — J.C. Patents

(57) ABSTRACT

A fabricating process of chip package structure is provided. First, a first substrate having a plurality of first bonding pads and a second substrate having a plurality of second bonding pads are provide, wherein a plurality of bumps are formed on the first bonding pads of the first substrate. A first two-stage adhesive layer is formed on the first substrate or on the second substrate and is B-stagized to form a first B-staged adhesive layer. A second two-stage adhesive layer is formed on the first B-staged adhesive layer and is B-stagized to form a second B-staged adhesive layer. Then, the first substrate and the second substrate are bonded via the first B-staged adhesive layer and the second B-staged adhesive layer such that each of the first bonding pads is respectively electrically connected to one of the second bonding pads via one of the bumps.

18 Claims, 24 Drawing Sheets ly related to the chip package and its fabricating process thereof.

CHIP PACKAGE

CROSS-REFERENCE TO RELATED APPLICATION

This application is a continuation-in-part of the prior application Ser. No. 11/361,646, filed Feb. 24, 2006. The prior application Ser. No. 11/361,646 is a divisional of a prior application Ser. No. 11/234,774, filed on Sep. 22, 2005. The entirety of each of the above-mentioned patent application is hereby incorporated by reference herein and made a part of this specification.

BACKGROUND OF THE INVENTION

1. Field of the Invention

The present invention generally relates to a chip package structure and a fabricating process thereof. More particularly, the present invention relates to a chip package structure utilizing at least two B-staged adhesive layers to bond substrates and a fabricating process thereof.

2. Description of Related Art

Following the increase of input/output contacts of an integrated circuit, chip package technology has become more and more diversified. This is due to the fact that Flip Chip (FC) Interconnect technology minimizes the thickness of the chip package, and reduces signal transmission path, etc. The most common used chip package structures applying the flip chip interconnect technology is, for example, Flip Chip Ball Grid Array (FC/BGA) package and the Flip Chip Pin Grid Array (FC/PGA) package.

Flip chip interconnect technology employs the method of defining area array by disposing a plurality of bonding pads onto the active surface of the chip and forming a plurality of bumps on the bonding pads, respectively. Next, the chip is flipped to connect the bonding bumps of the chip and a plurality of contact pads disposed on a carrier such as a circuit substrate. Therefore, the chip is electrically and mechanically connected to the carrier through the bumps. Further, the chip can be electrically connected to external electronic devices via the internal circuits of the carrier. Generally speaking, the bumps has several types such as the solder bump, the gold bump, the copper bump, the conductive polymer bump, the polymer bump, etc.

FIG. 1 is a schematic cross-sectional view showing a flip chip package structure having polymer bumps. Referring to FIG. 1, the flip chip package structure 100 comprises a substrate 110, a plurality of polymer bumps 120, a chip 130 and solder 140. The substrate 110 has a surface 110a and a plurality of contact pads 112 disposed on the surface 110a. The chip 130 has an active surface 130a and a plurality of bonding pads 132 disposed on the active surface 130a. The polymer bumps 120 made of polymer material with conductive property are respectively arranged between the contact pads 112 and the bonding pads 132 for electrically connecting the substrate 110 and the chip 130. The surface A of the solder 140 is adhered to the contact pad 112 and the surface B of the solder 140 is adhered to the polymer bump 120. Therefore, when external force or thermal stress (not shown) is applied to the flip chip package structure 100, the solder 140 may peel from the contact pads 112 such that the polymer bumps 120 can not be electrically connected to the contact pads 112. Obviously, the reliability of the flip chip package structure 100 is lower.

SUMMARY OF THE INVENTION

The present invention is to provide a fabricating process of a chip package structure having enhanced reliability.

The present invention is to provide a fabricating process of a chip package structure having enhanced reliability.

As embodied and broadly described herein, the present invention provides a fabricating process of a chip package structure. First, a first substrate having a plurality of first bonding pads and a second substrate having a plurality of second bonding pads are provide, wherein a plurality of bumps are formed on the first bonding pads of the first substrate. A first two-stage adhesive layer is formed on the first substrate or on the second substrate and is B-stagized to form a first B-staged adhesive layer. A second two-stage adhesive layer is formed on the first B-staged adhesive layer and is B-stagized to form a second B-staged adhesive layer. Then, the first substrate and the second substrate are bonded via the first B-staged adhesive layer and the second B-staged adhesive layer such that each of the first bonding pads is respectively electrically connected to one of the second bonding pads via one of the bumps. The method of B-stagization the first two-stage adhesive layer and the second two-stage adhesive layer includes heating (thermal curing) or UV curing.

According to an embodiment of the present invention, the first substrate and the second substrate are both chips.

According to an embodiment of the present invention, the first substrate is a carrier and the second substrate is a chip.

According to an embodiment of the present invention, the first substrate is a chip and the second substrate is a carrier.

According to an embodiment of the present invention, the bumps are stud bumps formed by wire bonder or plating bumps formed by plating process. The bumps are gold bumps, copper bumps, or solder bumps.

According to an embodiment of the present invention, the first two-stage adhesive layer is formed by screen printing, painting, spraying, spin-coating, or dipping.

According to an embodiment of the present invention, the second two-stage adhesive layer is formed by screen printing, painting, spraying, spin-coating, or dipping.

According to an embodiment of the present invention, the method for forming the first B-staged adhesive layer comprises forming a plurality of first two-stage adhesive pillars on the first bonding pads or on the second bonding pads; and B-stagizing the first two-stage adhesive pillars to form a plurality of first B-staged adhesive pillars.

According to an embodiment of the present invention, the method for forming the second B-staged adhesive layer comprises forming a plurality of second two-stage adhesive pillars on the first B-staged adhesive pillars; and B-stagizing the second two-stage adhesive pillars to form a plurality of second B-staged adhesive pillars.

According to an embodiment of the present invention, the first B-staged adhesive pillars are conductive while the second B-staged adhesive pillars are conductive or non-conductive. In another embodiment, the first B-staged adhesive pillars are non-conductive while the second B-staged adhesive pillars are conductive or non-conductive. Some conductive particles (e.g. silver particles, copper particles, gold particles) are doped in the first B-staged adhesive layer or the second B-staged adhesive layer to enable the first B-staged adhesive layer or the second B-staged adhesive layer being conductive.

According to an embodiment of the present invention, the first B-staged adhesive layer entirely covers the first substrate and the second B-staged adhesive layer comprises a plurality of second B-staged adhesive pillars.

In the fabricating process of a chip package structure of the present invention, the first B-staged adhesive layer and the second B-staged adhesive layer are both formed on the first substrate or on the second substrate, such that the bumps disposed between the first substrate and the second substrate can be encapsulated thereby. When an external force or thermal stress is applied to the chip package structure, the first two-stage adhesive layer and the second two-stage adhesive layer are capable of preventing the bumps from damage, such that reliability of the chip package structure is further enhanced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
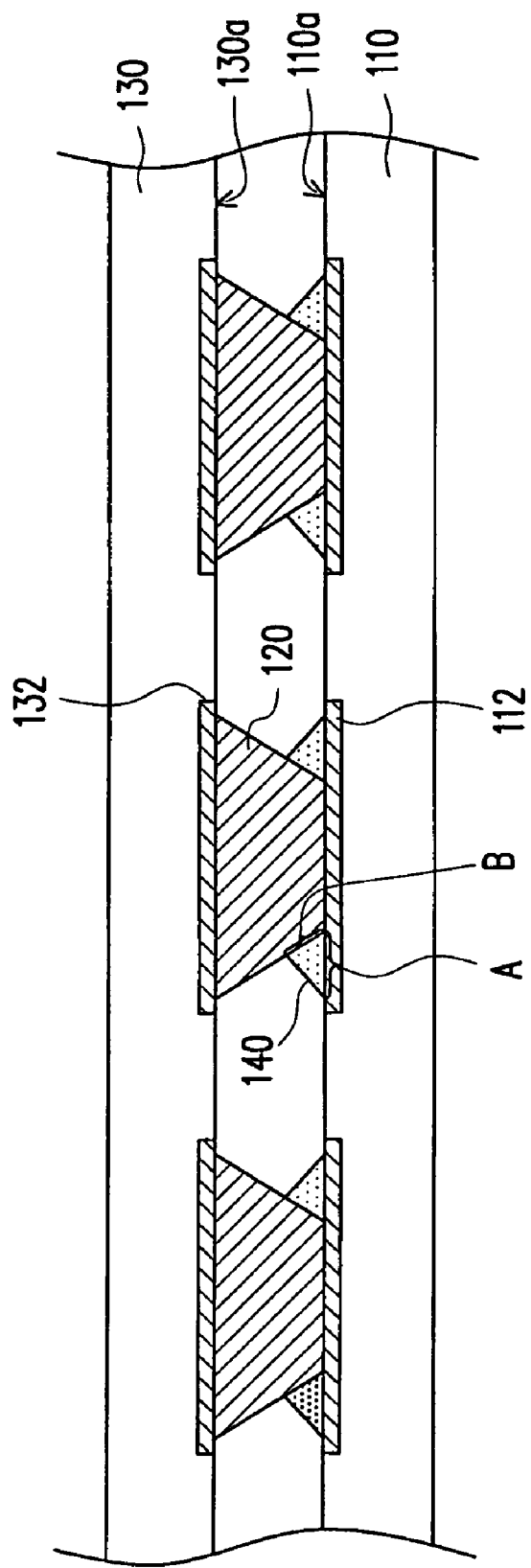
FIG. 1 is a schematic cross-sectional view showing a flip chip package structure having polymer bumps.

Reference will now be made in detail to the present embodiments of the invention, examples of which are illustrated in the accompanying drawings. Wherever possible, the same reference numbers are used in the drawings and the description to refer to the same or like parts.

Figure 2A:
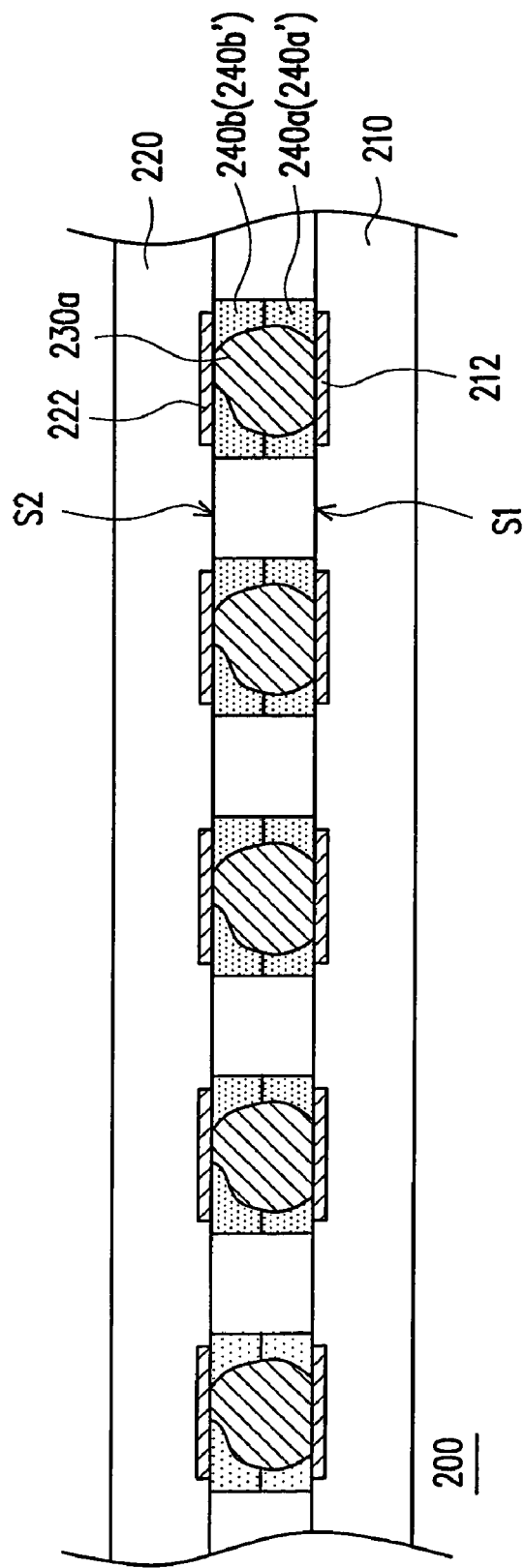
FIG. 2A and FIG. 2B are schematic cross-sectional views illustrating chip package structures according to an embodiment of the present invention.
Figure 2B:
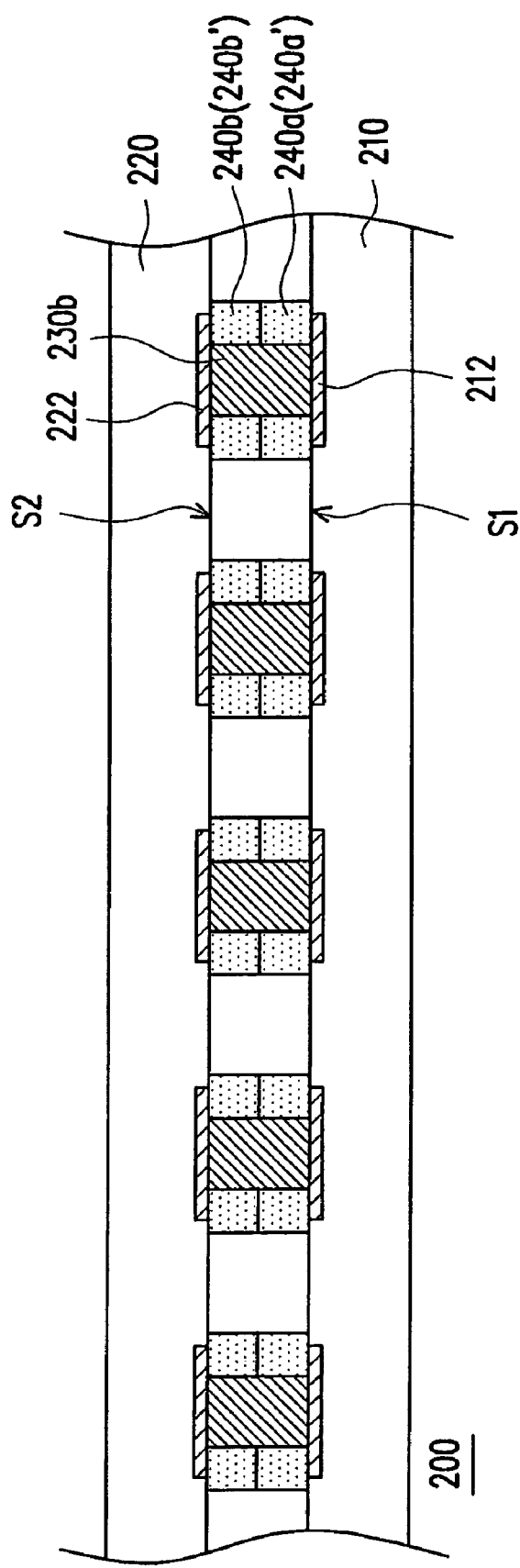

FIG. 2A and FIG. 2B are schematic cross-sectional views illustrating chip package structures according to an embodiment of the present invention. Referring to FIG. 2A and FIG. 2B, the chip package structure 200 of the present invention comprises a first substrate 210, a second substrate 220, a plurality of bumps 230, a first B-staged adhesive layer 240a and a second B-staged adhesive layer 240b. The first substrate 210 has a plurality of first bonding pads 212. The second substrate 220 has a plurality of second bonding pads 222, and the second substrate 220 is disposed above the first substrate 210. The bumps 230 are disposed between the first substrate 210 and the second substrate 220, wherein each of the first bonding pads 212 is respectively electrically connected to one of the second bonding pads 222 via one of the bumps 230. The first B-staged adhesive layer 240a is adhered on the second substrate 210. The second B-staged adhesive layer 240b is adhered between the first B-staged adhesive layer 240a and the first substrate 220, wherein the first B-staged adhesive layer 240a and the second B-staged adhesive layer 240b encapsulate the bumps 230. Additionally, composition of the first B-staged adhesive layer 240a can be substantially the same with that of the second B-staged adhesive layer 240b. As shown in FIG. 2A and FIG. 2B, the first B-staged adhesive layer 240a is adhered on the surface S1 of the first substrate 210 and the second B-staged adhesive layer 240b is adhered on the surface S2 of the second substrate 220. It is noted that the invention utilizes the first B-staged adhesive layer 240a and the second B-staged adhesive layer 240b to enhance the adhesion between the first substrate 210 and the second substrate 220, such that reliability of the chip package structure 200 can be enhanced.

As shown in FIG. 2A and FIG. 2B, in the present embodiment, the thickness of the first B-staged adhesive layer 240a is substantially equal to the thickness of the second B-staged adhesive layer 240b. However, base on actual design requirements, the thickness of the first B-staged adhesive layer 240a may also be different from that of the second B-staged adhesive layer 240b.

The first substrate 210 comprises a plurality of first bonding pads 212 arranged on a surface S1 thereof. The second substrate 220 is arranged above the first substrate 210 and comprises a plurality of second bonding pads 222 arranged on a surface S2 thereof. According to the present embodiment, the first substrate 210 and the second substrate 220 can be both chips. In another embodiment of the invention, one of the first substrate 210 and the second substrate 220 is a chip. The types of the first substrate 210 and the second substrate 220 are not limited in the present invention. The bumps 230a or 230b are arranged between the first bonding pads 212 and the second bonding pads 222. Specifically, the upper end of each bump 230a or 230b contacts with the second bonding pad 222 and the lower end of each bump 230a or 230b contacts with the first bonding pads 212.

In the present embodiment, the bumps 230 are stud bumps 230a (shown in FIG. 2A), and the stud bumps 230a can be gold stud bumps. In another embodiment of the present invention, the bumps 230 may be plating bumps 230b (shown in FIG. 2B). Each of the stud bumps 230a or each of the plating bumps 230b is encapsulated by one of the adhesive pillars 240a'. The plating bumps 230b may be gold bumps, copper bumps or other conductive bumps.

According to the present embodiment, the first B-staged adhesive layer 240a comprises a plurality of first B-staged adhesive pillars 240a' and the second B-staged adhesive layer 240b comprises a plurality of second B-staged adhesive pillars 240b', wherein the first B-staged adhesive pillars 240a' are adhered on the surface S1 of the first substrate 210 and the second B-staged adhesive pillars 240b' are adhered on the surface S2 of the second substrate 220. In the present embodiment, the first B-staged adhesive pillars 240a' are conductive or non-conductive while the second B-staged adhesive pillars 240b' are conductive or non-conductive. Since the first B-staged adhesive pillars 240a' are electrically insulated from one another and the second B-staged adhesive pillars 240b' are electrically insulated from one another, the short circuit between the bumps 230 can be prevented even though the first B-staged adhesive pillars 240a' and the second B-staged adhesive pillars 240b' are both conductive.

In the present embodiment, the first B-staged adhesive layer 240a and the second B-staged adhesive layer 240b can be obtained from 8008 or 8008HT of ABLESTIK, and the glass transition temperature of which is between about 80° C. and about 300° C. Additionally, the first B-staged adhesive layer 240a and the second B-staged adhesive layer 240b can be obtained from 6200, 6201 or 6202C of ABLESTIK or obtained from SA-200-6, SA-200-10 provided by HITACHI Chemical CO., Ltd., and the glass transition temperature of which is between about −40° C. and about 150° C. The glass transition temperature of the first B-staged adhesive layer 240a is greater than, equal to or smaller than the glass transition temperature of the second B-staged adhesive layer 240b. Additionally, some conductive particles (e.g. silver particles, copper particles, gold particles) are doped in the first B-staged adhesive layer 240a and the second B-staged adhesive layer 240b, for example.

Figure 3A:
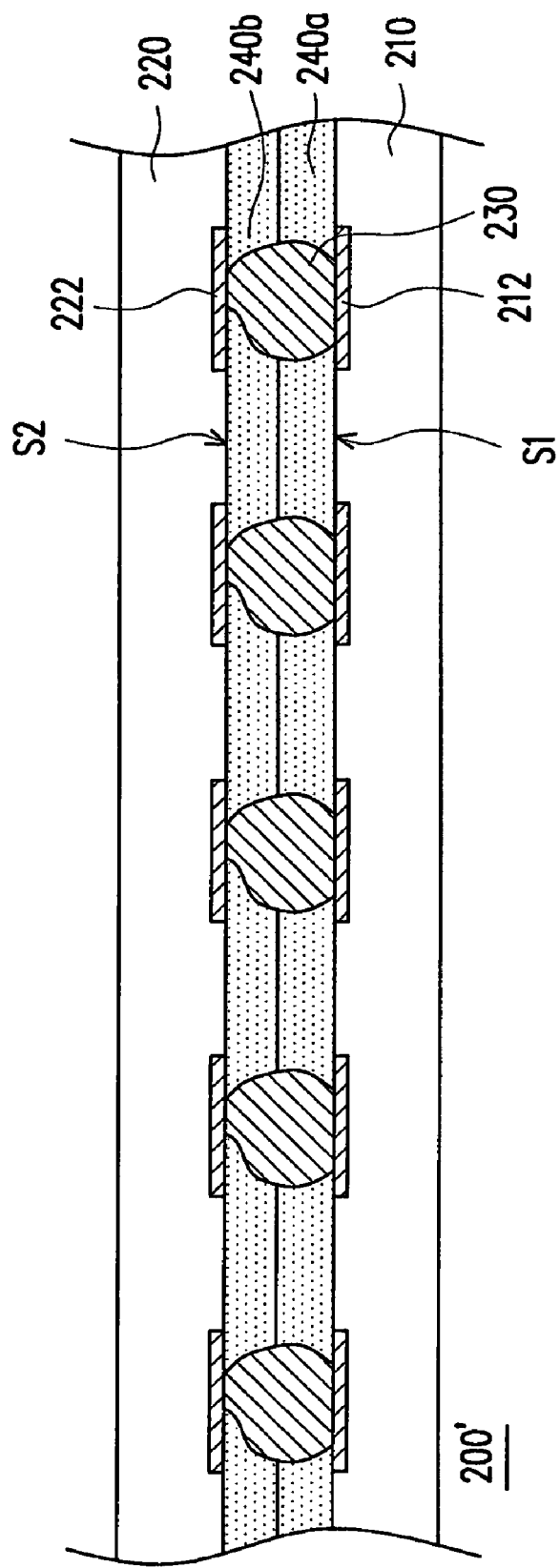
FIG. 3A to FIG. 3D are schematic cross-sectional views illustrating chip package structures according to another embodiment of the present invention.
Figure 3B:
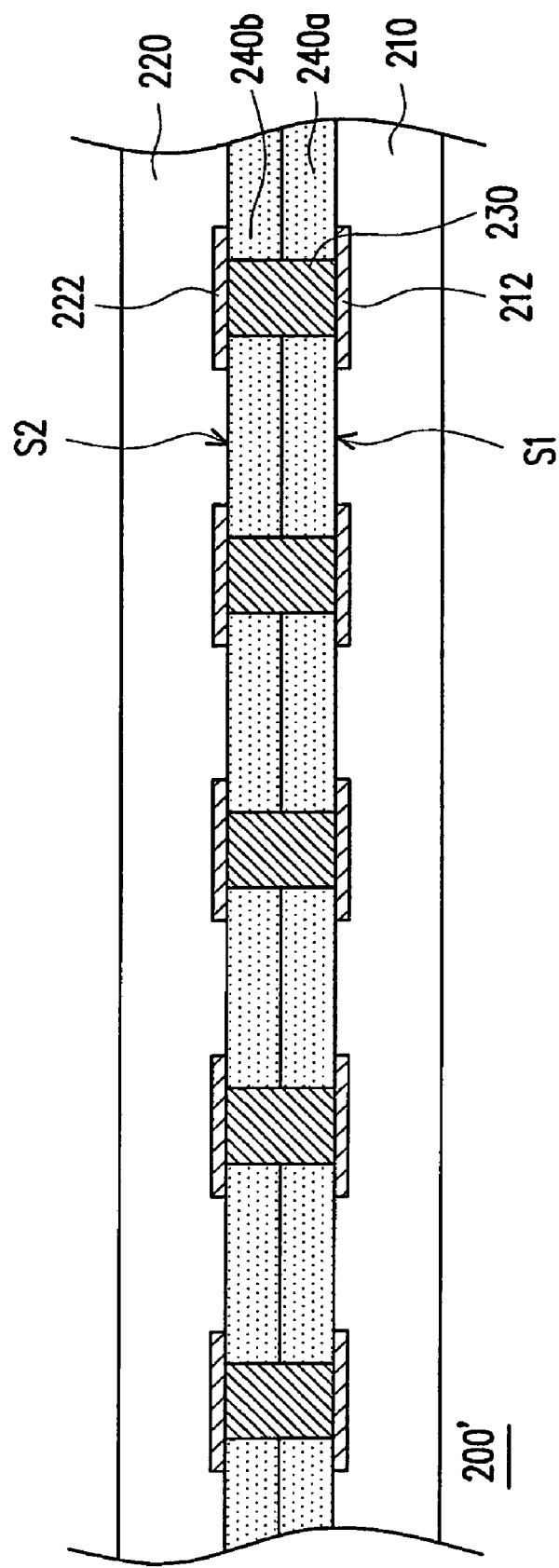

FIG. 3A to FIG. 3D are schematic cross-sectional views illustrating chip package structures according to another embodiment of the present invention. Referring to FIG. 3A and FIG. 3B, the chip package structure 200' of the present embodiment is similar to the chip package structure 200 shown in FIG. 2A and FIG. 2B except that the first B-staged adhesive layer 240a and the second B-staged adhesive layer 240b entirely fill the gaps between the bumps 230. Specifically, the first B-staged adhesive layer 240a and the second B-staged adhesive layer 240b are both non-conductive so as to prevent short circuit between the bumps 230.

Figure 3C:
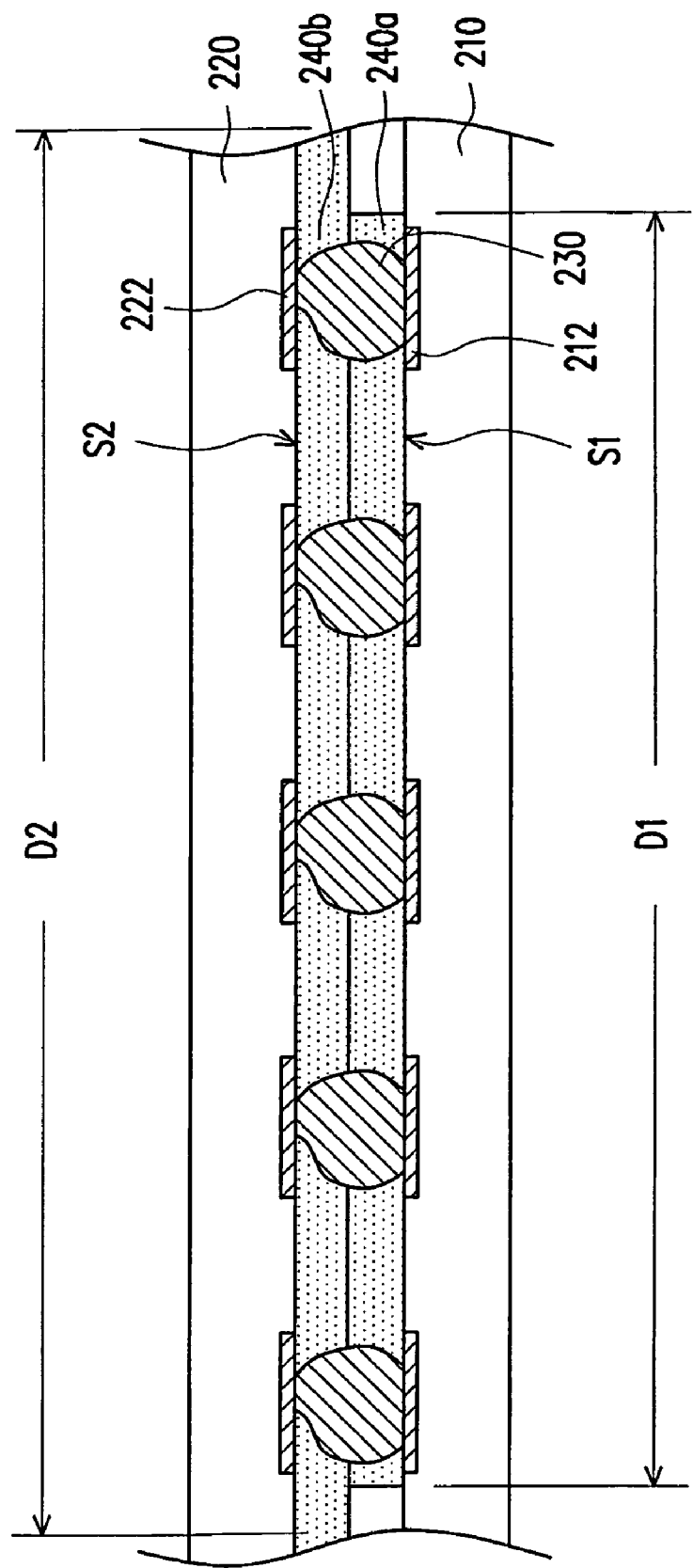

Referring to FIG. 3C, the chip package structure 200" of the present embodiment is similar to the chip package structure 200' shown in FIG. 3A except that the size D1 of the first B-staged adhesive layer 240a is different from the size D2 of the second B-staged adhesive layer 240b. As shown in FIG. 3C, the size D1 of the first B-staged adhesive layer 240a is smaller than the size D2 of the second B-staged adhesive layer 240b such that a portion area of the first substrate 210 is exposed by the first B-staged adhesive layer 240a. The first B-staged adhesive layer 240a entirely covers the surface S1 of the first substrate 210 except areas occupied by the bumps 230, and the second B-staged adhesive layer 240b exposes peripheral region of the surface S2 of the second substrate 220.

Figure 3D:
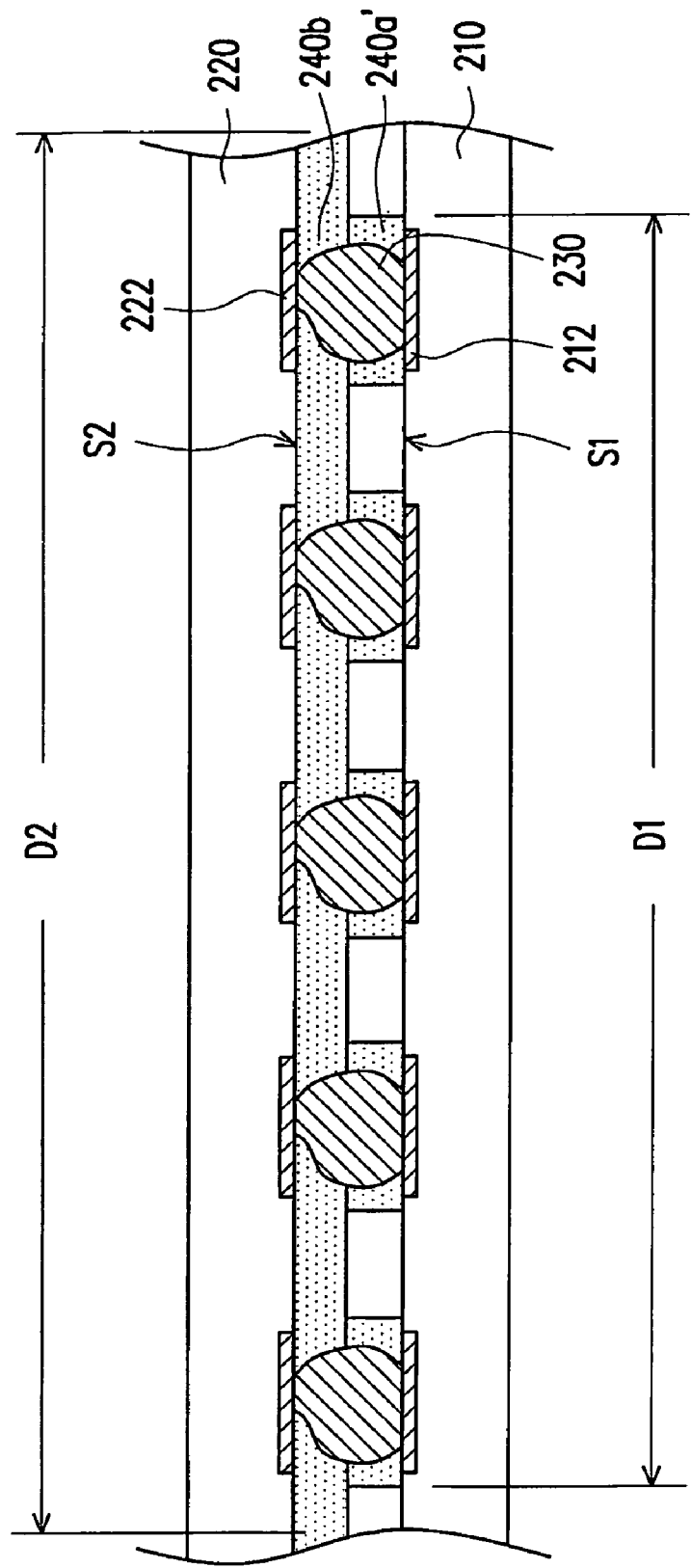

Referring to FIG. 3D, the chip package structure 200'" of the present embodiment is similar to the chip package structure 200" shown in FIG. 3C except that the first B-staged adhesive layer 240a comprises a plurality of first B-staged adhesive pillars 240a'.

Figure 4:
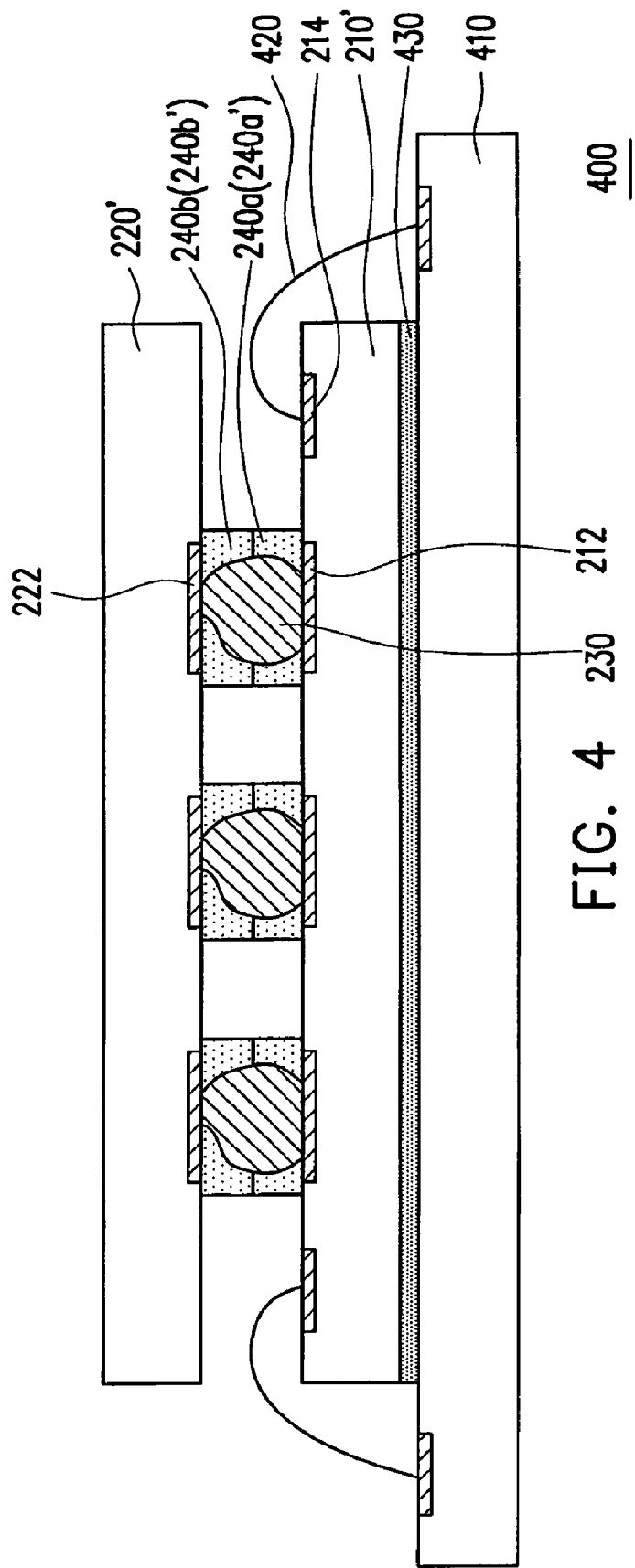
FIG. 4 is a schematic cross-sectional view illustrating a stacked-type chip package structure according to an embodiment of the present invention.

FIG. 4 is a schematic cross-sectional view illustrating a stacked-type chip package structure according to an embodiment of the present invention. Referring to FIG. 4, the stacked-type chip package structure 400 comprises a carrier 410, the first chip 210, a second chip 220, a plurality of bumps 230, a first B-staged adhesive layer 240a, a second B-staged adhesive layer 240b and a plurality of bonding wires 420. The arrangement of the first chip 210, the second chip 220, the bumps 230 and the adhesive material 240 may be the same as the above-mentioned embodiments (as shown in FIG. 2A and FIG. 2B). In the present embodiment, the first chip 210' is bonded to the carrier 410 through an adhesive layer 430 (e.g. epoxy, silver paste, DAF, and so on), and is electrically connected to the carrier 410 via the bonding wires 420. Specifically, the first chip 210' has wire bonding pads 224 electrically connected to the carrier 410 via the bonding wires 420.

Figure 5:
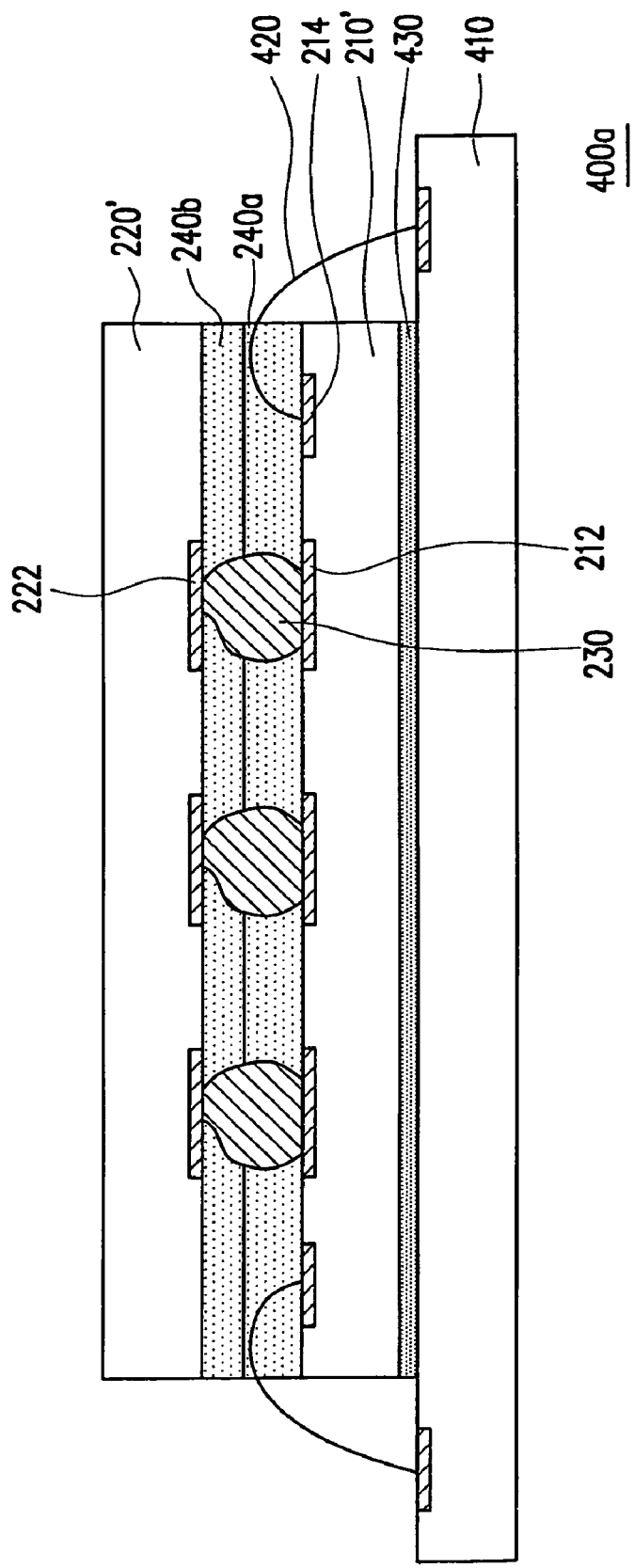
FIGS. 5-7 are schematic cross-sectional views illustrating stacked-type chip package structures according to various embodiments of the present invention.
Figure 6:
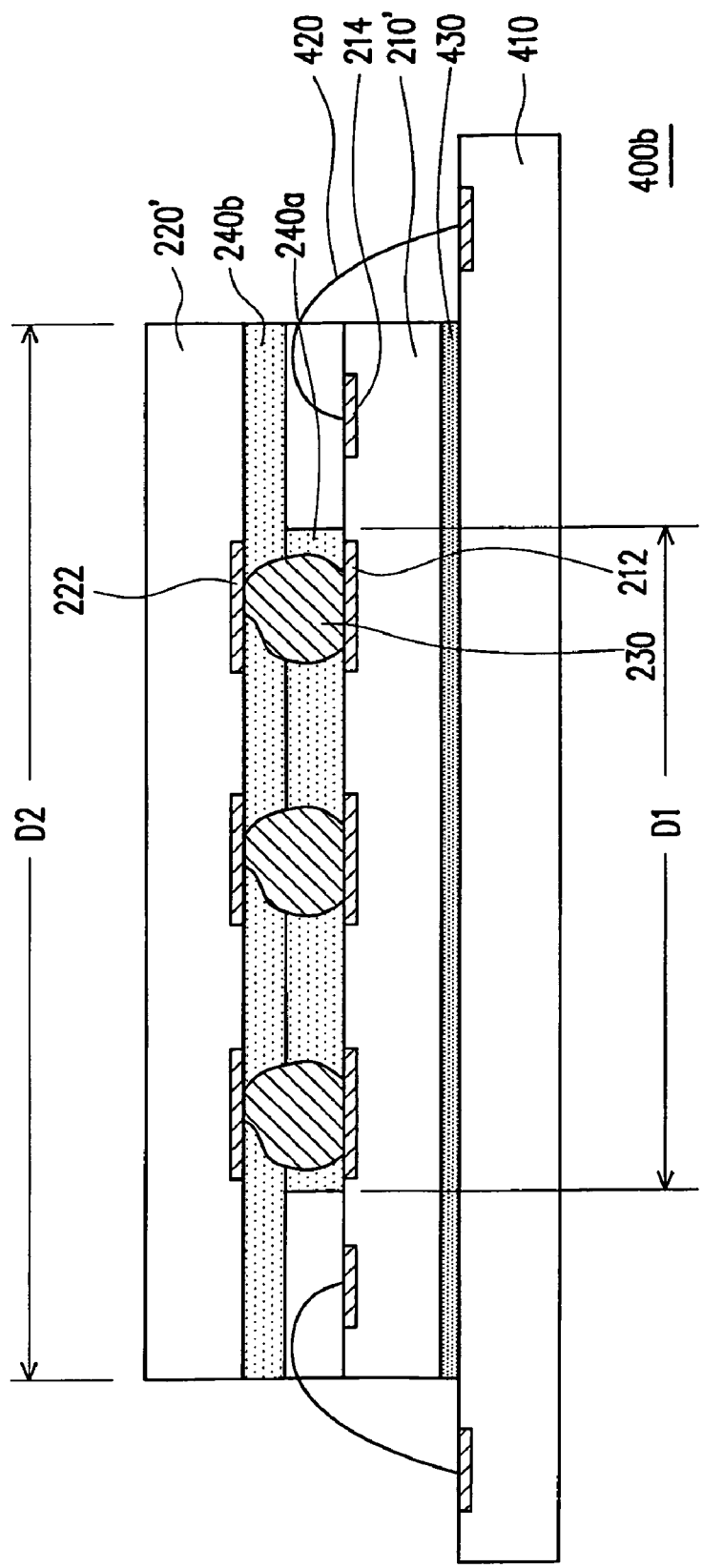
Figure 7:
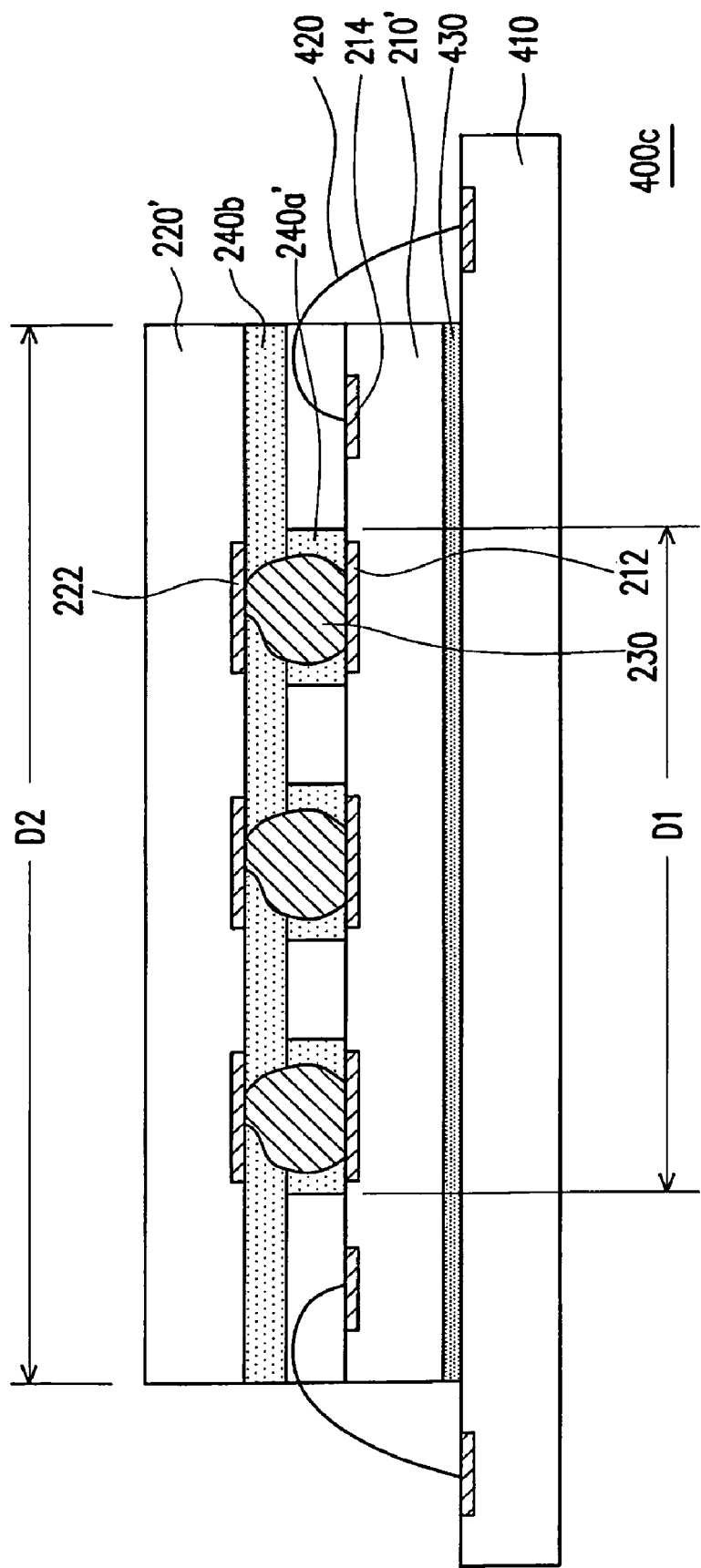

FIGS. 5-7 are schematic cross-sectional views illustrating stacked-type chip package structures according to various embodiments of the present invention. Referring to FIG. 5, the stacked-type chip package structure 400a comprises a carrier 410, a first chip 210', a second chip 220', a plurality of bumps 230, a first B-staged adhesive layer 240a, a second B-staged adhesive layer 240b and a plurality of bonding wires 420. The arrangement of the first chip 210', the second chip 220', the bumps 230, the first B-staged adhesive layer 240a and the second B-staged adhesive layer 240b is substantially the same with the arrangement as shown in FIG. 3A or FIG. 3B. The first chip 210' is bonded to the carrier 410 through an adhesive layer 430 (e.g. epoxy, silver paste, DAF, and so on), and is electrically connected to the carrier 410 via the bonding wires 420. Specifically, the first chip 210' has wire bonding pads 214 electrically connected to the carrier 410 via the bonding wires 420. An end of the bonding wires 420 connected to the wire bonding pads 214 is encapsulated by the first B-staged adhesive layer 240a. The stand-off between the first chip 210' and the second chip 220' is maintained by at least one of the first B-staged adhesive layer 240a and the second B-staged adhesive layer 240b, such that the bonding wires 420 can be protected from damage.

Referring to FIG. 6 and FIG. 7, in the stacked-type chip package structure 400b and 400c, the arrangement of the first chip 210', the second chip 220', the bumps 230, the first B-staged adhesive layer 240a and the second B-staged adhesive layer 240b may also be the same as or similar with the above-mentioned embodiments shown in FIG. 3C and FIG. 3D. As shown in FIG. 6 and FIG. 7, wire bonding pads 214 of the first chip 210' are exposed by the first B-staged adhesive layer 240a (shown in FIG. 6) or the first B-staged adhesive pillars 240a' (shown in FIG. 7) such that the bonding wires 420 are not encapsulated by the first B-staged adhesive layer 240a (shown in FIG. 6) or the first B-staged adhesive pillars 240a' (shown in FIG. 7).

The fabricating process of the chip package structure 200 illustrated in FIG. 2A is described as followings. It is noted that the fabricating process of the chip package structures 200' illustrated in FIGS. 3A-3B are similar with the fabricating process disclosed in FIGS. 8A to 8D. Therefore, descriptions regarding the fabricating process of the chip package structures 200' illustrated in FIGS. 3A-3B are omitted.

Figure 8A:
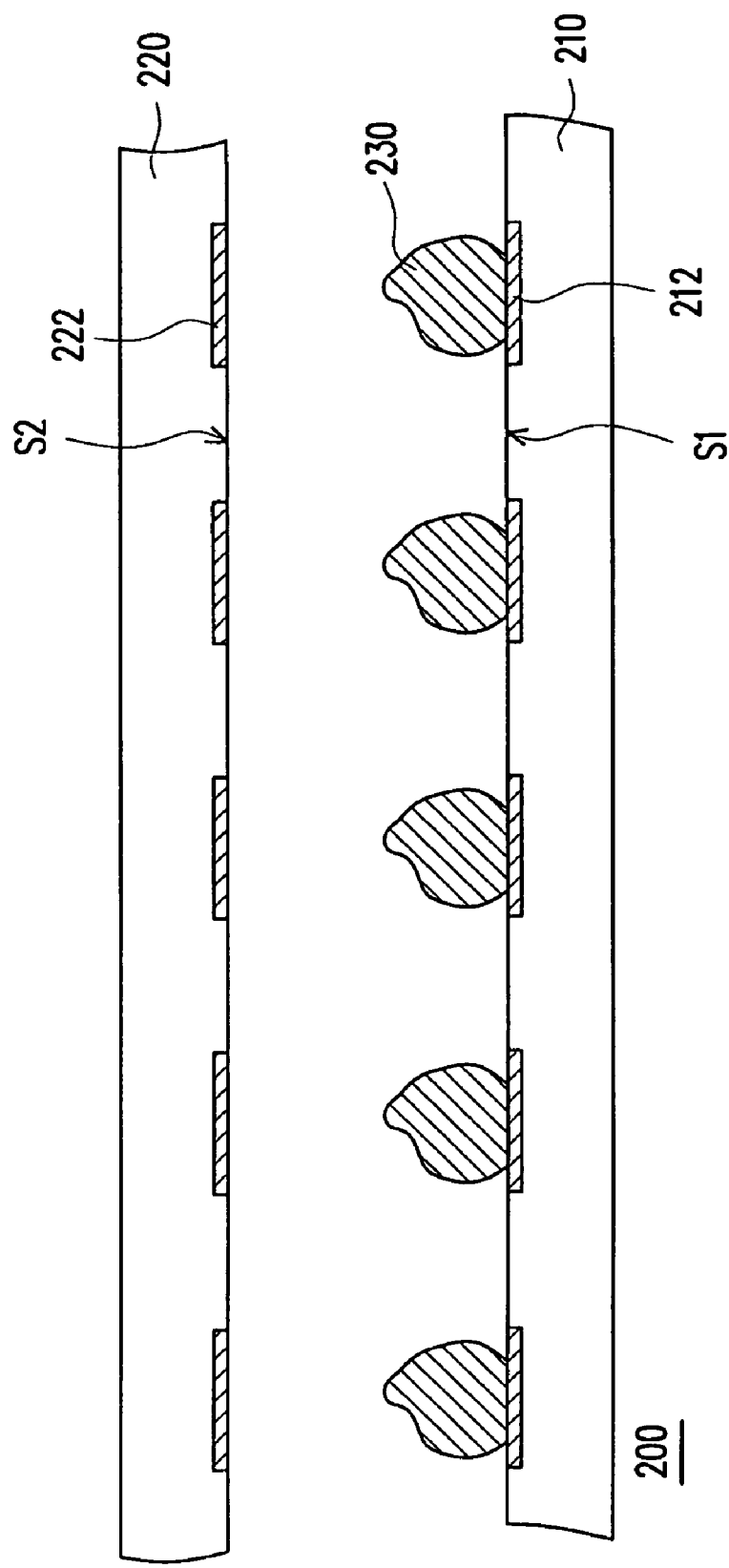
FIGS. 8A to 8F are schematic cross-sectional views illustrating a fabricating process of the chip package structure 200 illustrated in FIG. 2A.

FIGS. 8A to 8F are schematic cross-sectional views illustrating a fabricating process of the chip package structure 200 illustrated in FIG. 2A. Referring to FIG. 8A, a first substrate 210 having a plurality of first bonding pads 212 and a second substrate 220 having a plurality of second bonding pads 222 are provide, wherein a plurality of bumps 230 are formed on the first bonding pads 212 of the first substrate 210. In the present embodiment, the bumps 230 are stud bumps formed by wire bonder similar with the bumps 230a shown in FIG. 2A. In another embodiment, the bumps 230 are plating bumps formed by plating process similar with the bumps 230b shown in FIG. 2B.

In the present embodiment, the first substrate 210 is a carrier, such as the printed circuit board (PCB), and the second substrate 220 is a chip. The PCB may be FR4, FR5, BT, PI circuit substrate. In another embodiment of the present invention, the first substrate 210 maybe a carrier and the second substrate 220 may be a chip. In still another embodiment of the present invention, the first substrate 210 may be a chip and the second substrate 220 may be a carrier.

Figure 8B:
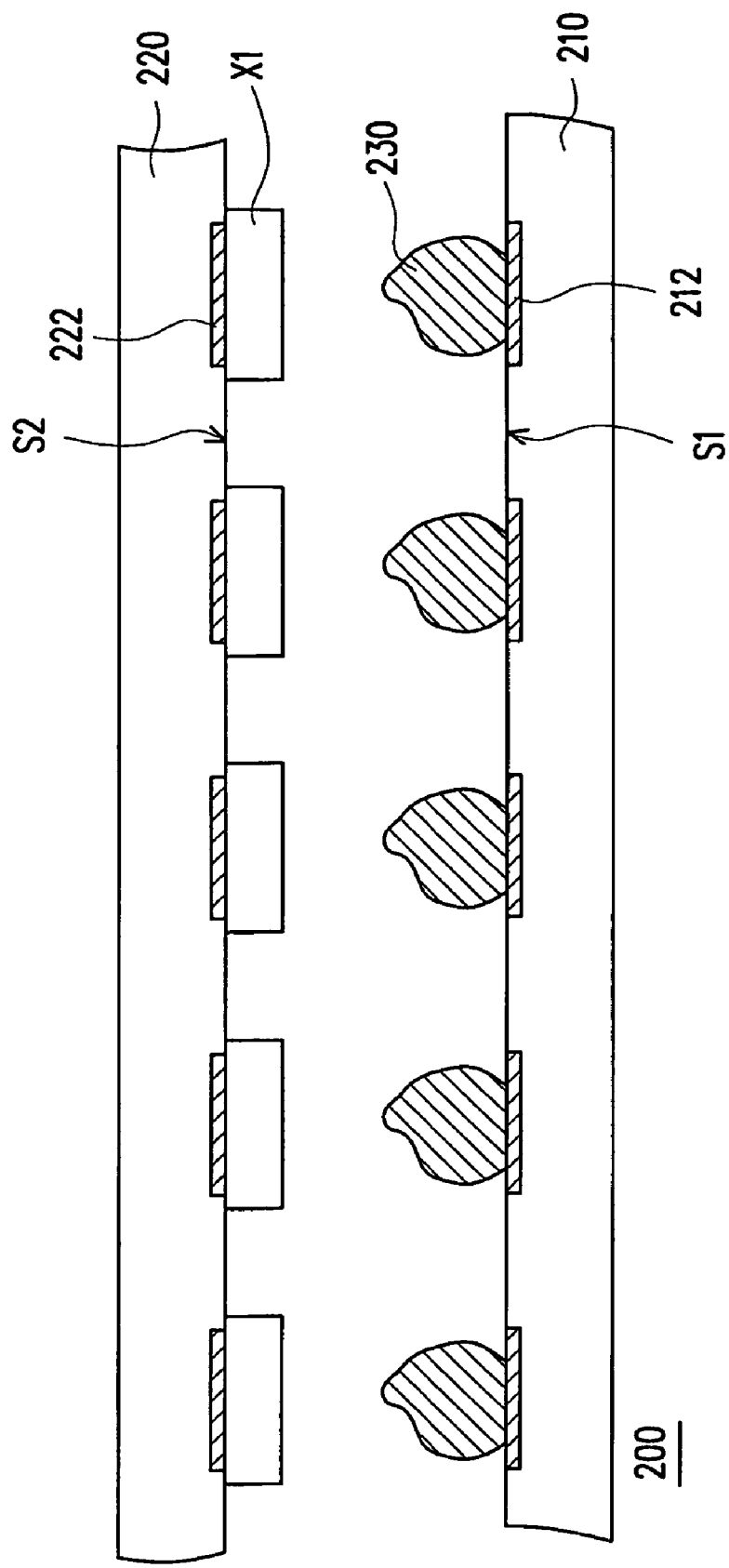
Figure 8C:
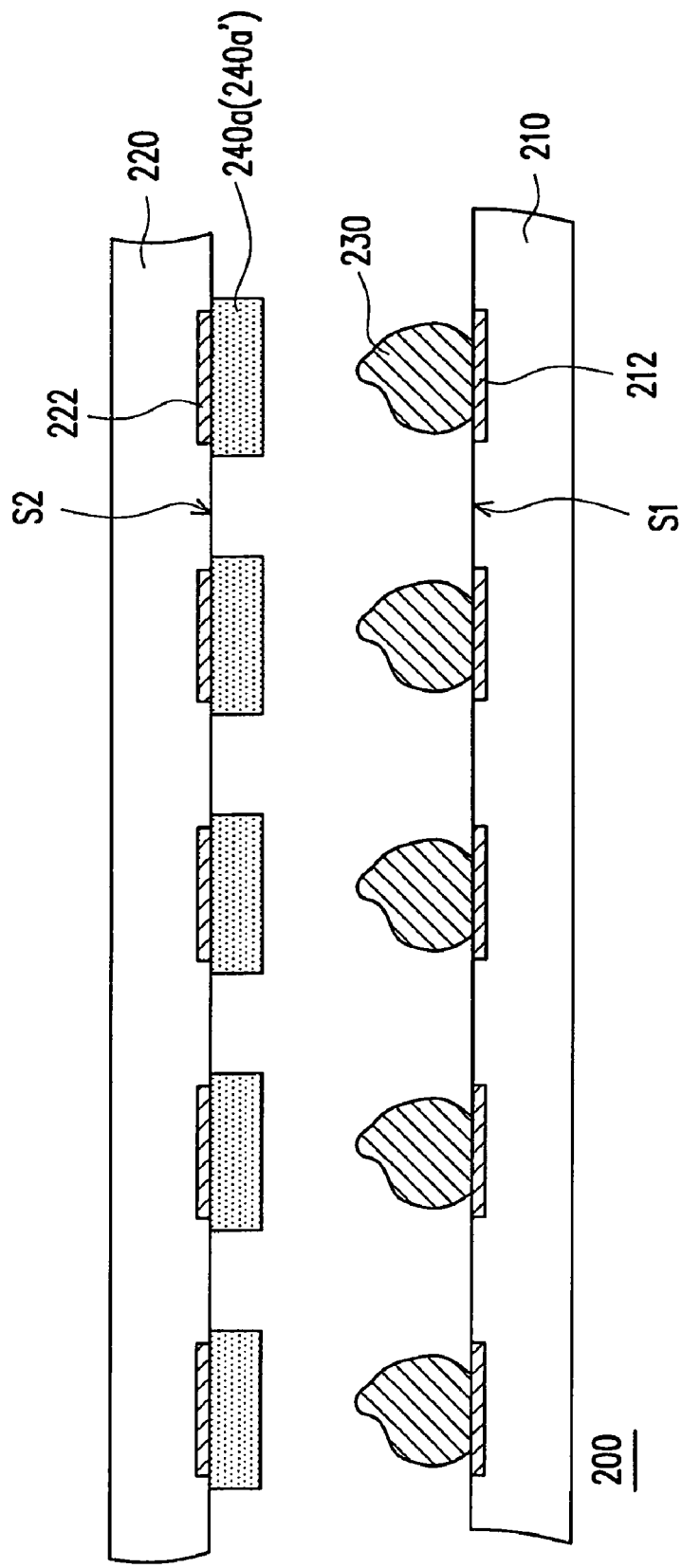

Referring to FIG. 8B and FIG. 8C, a first two-stage adhesive layer X1 is formed on the second substrate 220 and is then B-stagized (i.e. pre-cured or partially cured) to form a first B-staged adhesive layer 240a including a plurality of first B-staged adhesive pillars 240a'.

Figure 8D:
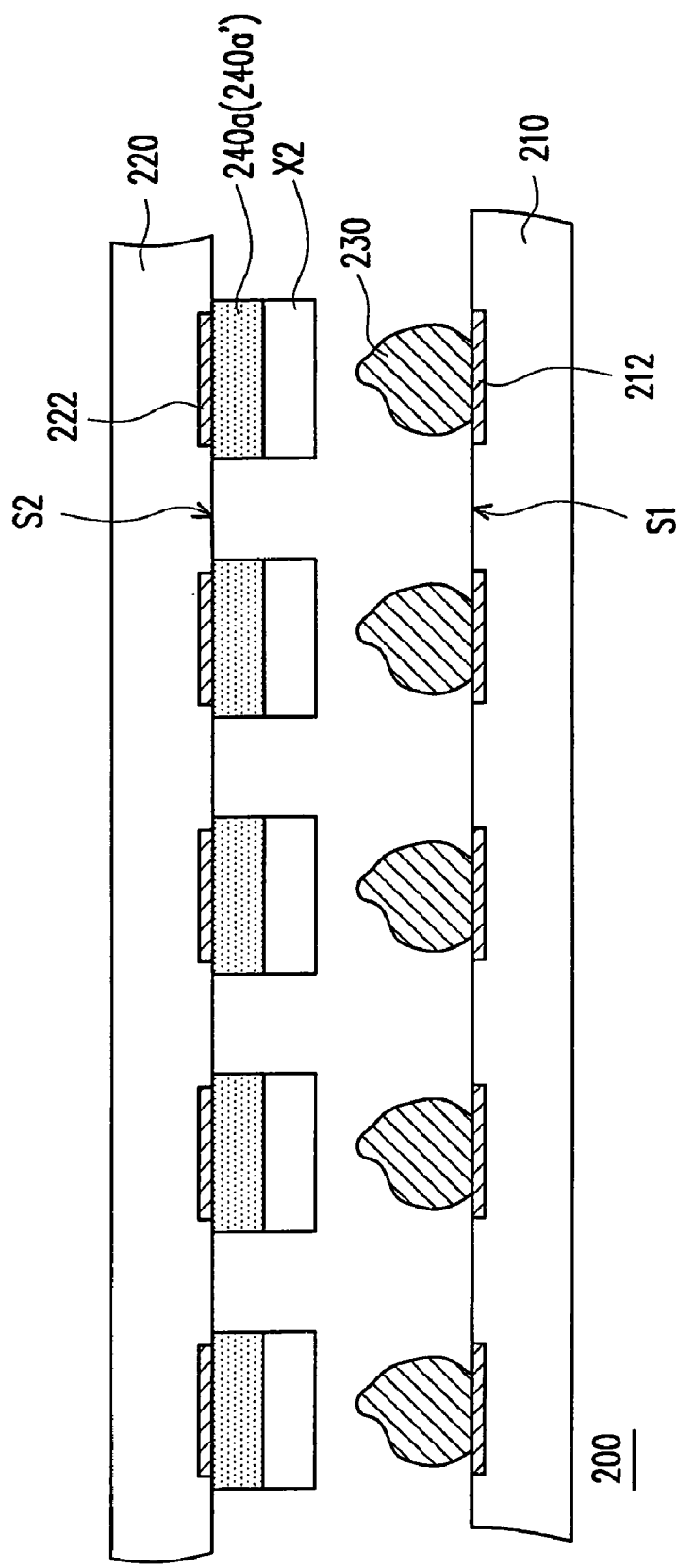
Figure 8E:
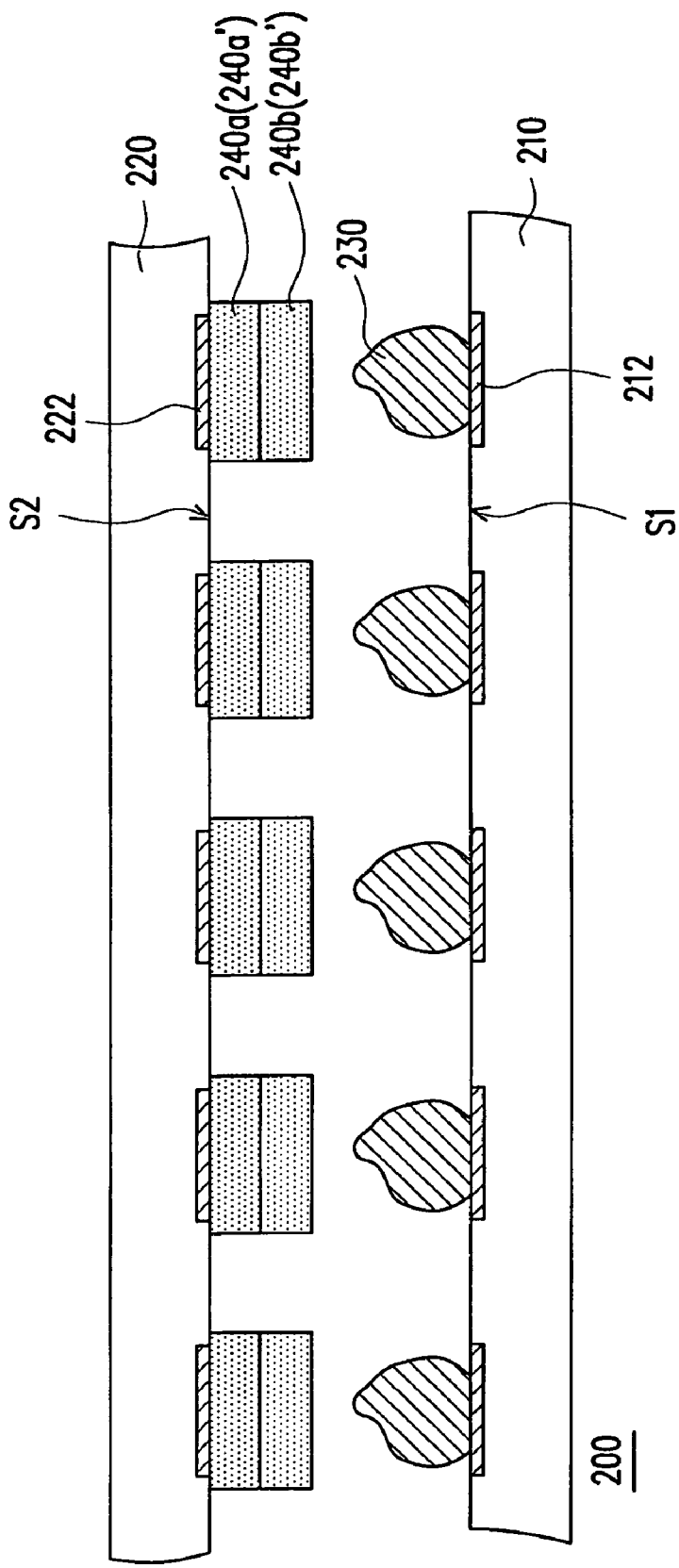

Referring to FIG. 8D and FIG. 8E, a second two-stage adhesive layer X2 is formed on the first B-staged adhesive layer 240a (the first B-staged adhesive pillars 240a') and is then B-stagized to form a second B-staged adhesive layer 240b including a plurality of second B-staged adhesive pillars 240b'. Specifically, since the first two-stage adhesive layer X1 and the second two-stage adhesive layer X2 are made from a thermosetting adhesive material with two-stage (A-stage and B-stage) property, the first B-staged adhesive layer 240a and the second B-staged adhesive layer 240b are formed after the first two-stage adhesive layer X1 and the second two-stage adhesive layer X2 are B-stagized. In the present embodiment, the material of the thermosetting adhesive material with two-stage property may be polyimide, polyquinolin, benzocyclobutene, or the like. Specifically, the first B-staged adhesive layer 240a and the second B-staged adhesive layer 240b can be obtained from 8008 or 8008HT of ABLESTIK, and the glass transition temperature of which is between about 80° C. and about 300° C. Additionally, the first B-staged adhesive layer 240a and the second B-staged adhesive layer 240b can be obtained from 6200, 6201 or 6202C of ABLESTIK or obtained from SA-200-6, SA-200-10 provided by HITACHI Chemical CO., Ltd., and the glass transition temperature of which is between about −40° C. and about 150° C. Preferably, the glass transition temperature of the first B-staged adhesive layer 240a is greater than, equal to or smaller than the glass transition temperature of the second B-staged adhesive layer 240b. Additionally, some conductive particles (e.g. silver particles, copper particles, gold particles) are doped in the first B-staged adhesive layer 240a and the second B-staged adhesive layer 240b, for example. Besides, the thermosetting adhesive material with two-stage property can be conductive or non-conductive, and they can be formed by screen printing, painting, spraying, spin-coating, or dipping. In those steps shown in FIG. 8B and FIG. 8D, the thermosetting adhesive material with two-stage property may be in liquid or gel state such that the can be easy to spread over the second substrate 220. The type of the thermosetting adhesive material is not limited in the present invention.

Figure 8F:
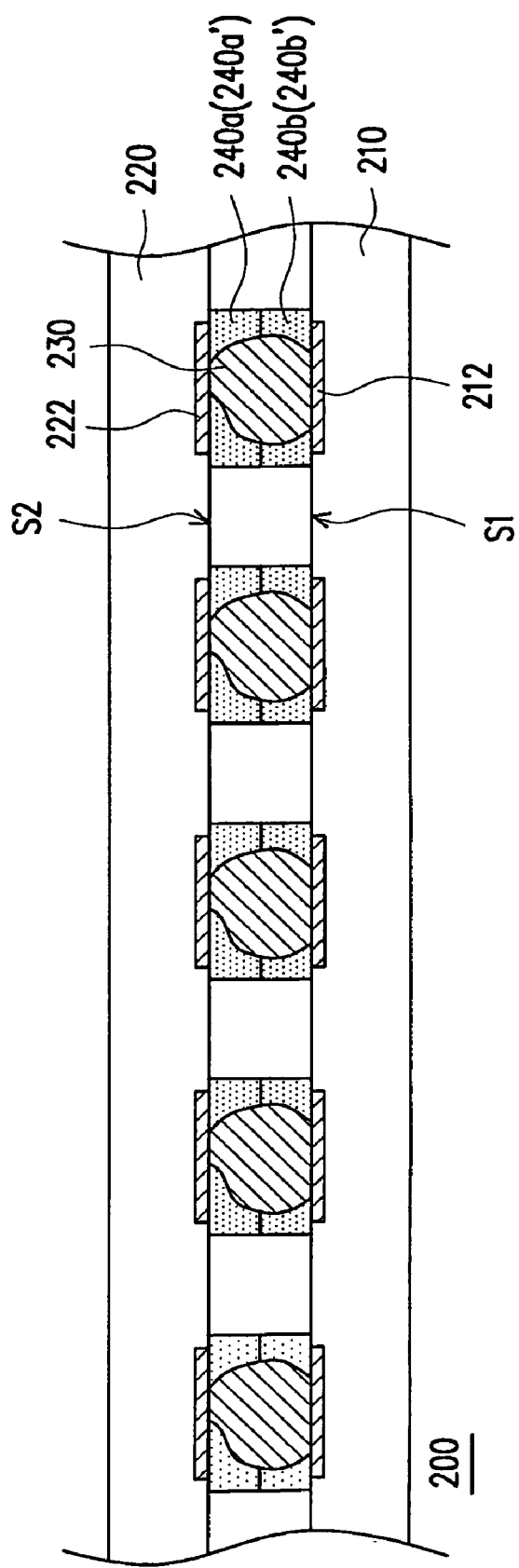

Referring to FIG. 8F, after the first B-staged adhesive layer 240a and the second B-staged adhesive layer 240b are formed, the first substrate 210 and the second substrate 220 are bonded via the second B-staged adhesive layer 240b such that each of the first bonding pads 212 is respectively electrically connected to one of the second bonding pads 222 via one of the bumps 230. Specifically, the second B-staged adhesive layer 240b are bonded to the surface S1 of the first substrate 210 by further curing the first B-staged adhesive layer 240a and the second B-staged adhesive layer 240b. If necessary, a post-curing process may be performed after the first B-staged adhesive layer 240a and the second B-staged adhesive layer 240b are fully cured.

In order to ensure the electrical connection between the first substrate 210 and the second substrate 220, the overall thickness of the first B-staged adhesive layer 240a and the second B-staged adhesive layer 240b should be carefully controlled such that the bumps 230 are capable of piercing the first B-staged adhesive layer 240a and the second B-staged adhesive layer 240b and connecting with the second bonding pads 222 of the second substrate 220. In the present embodiment, the thickness of the first B-staged adhesive layer 240a is substantially equal to the thickness of the second B-staged adhesive layer 240b. However, base on actual design requirements, the thickness of the first B-staged adhesive layer 240a may also be different from that of the second B-staged adhesive layer 240b.

According to the present embodiment, the method for forming the first B-staged adhesive layer 240a comprises forming a plurality of first two-stage adhesive pillars on the first bonding pads 212 or on the second bonding pads 222 and B-stagizing the first two-stage adhesive pillars to form a plurality of first B-staged adhesive pillars 240a'. Additionally, the method for forming the second B-staged adhesive layer 240b comprises forming a plurality of second two-stage adhesive pillars on the first B-staged adhesive pillars 240a' and B-stagizing the second two-stage adhesive pillars to form a plurality of second B-staged adhesive pillars 240b'.

The configurations of the first B-staged adhesive layer 240a and the second B-staged adhesive layer 240b are not limited in the present invention, the configurations shown in FIG. 8A to FIG. 8F is merely described for illustration. Other configurations of the first B-staged adhesive layer 240a and the second B-staged adhesive layer 240b are illustrated as follow.

Figure 9A:
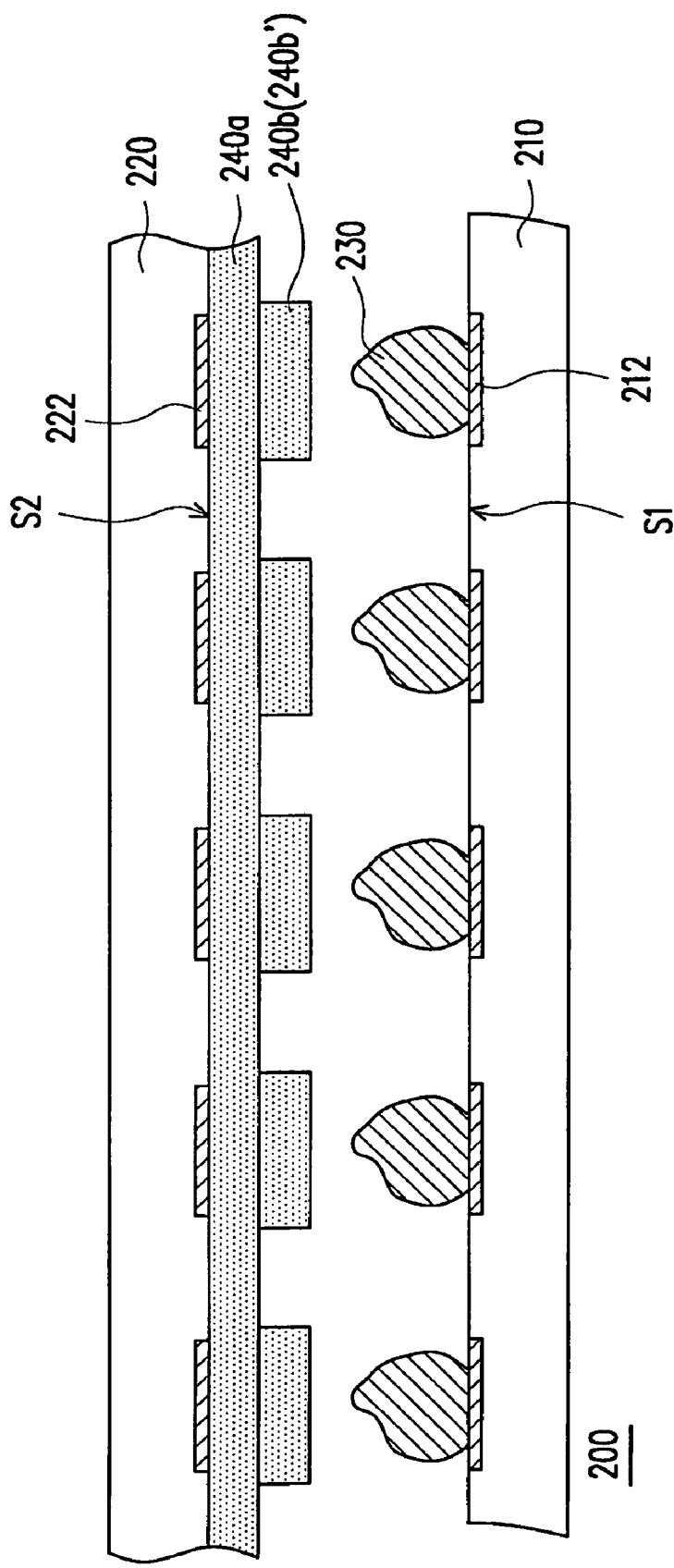
FIG. 9A to FIG. 9C are schematic cross-sectional views illustrating chip package structures according to various embodiments of the present invention.
Figure 9B:
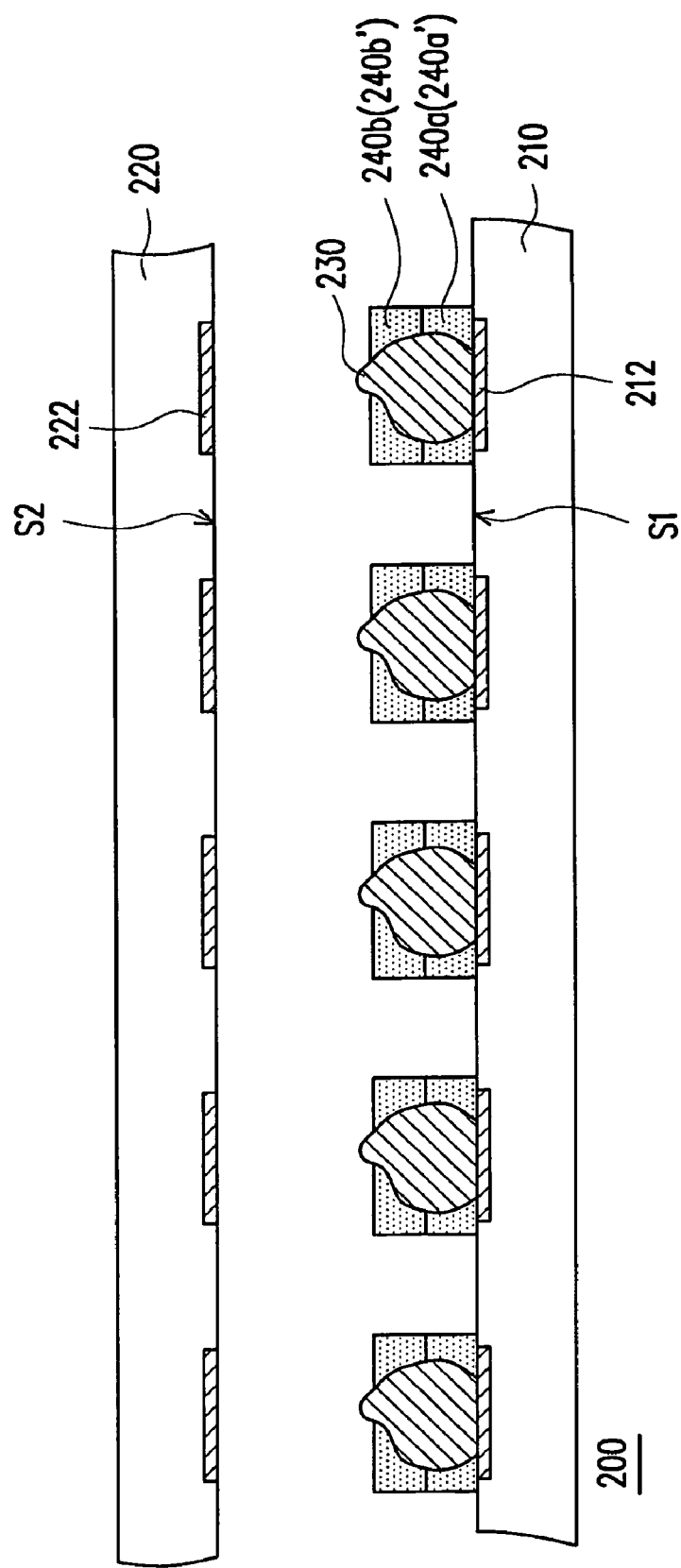
Figure 9C:
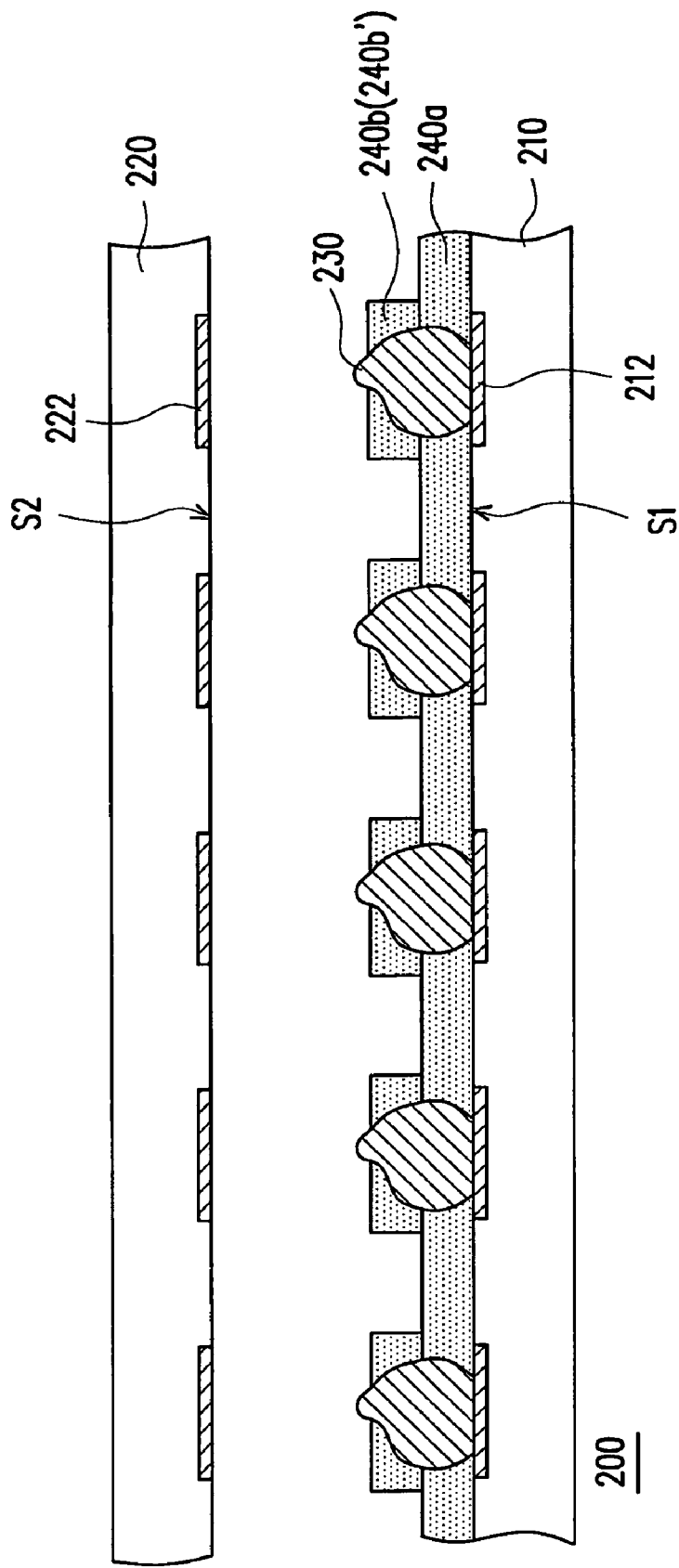

FIG. 9A to FIG. 9C are schematic cross-sectional views illustrating chip package structures according to various embodiments of the present invention. Referring to FIG. 9A, in an embodiment of the present invention, the first B-staged adhesive layer 240a is formed on and entirely covers the surface S2 of the second substrate 220, while the second B-staged adhesive layer 240b including a plurality the second B-staged adhesive pillars 240b' is formed on the first B-staged adhesive layer 240a (as shown in FIG. 9A). In another embodiment as shown in FIG. 9B, the first B-staged adhesive layer 240a including the first B-staged adhesive pillars 240a' is formed on the surface S1 of the first substrate 210, while the second B-staged adhesive layer 240b including the second B-staged adhesive pillars 240b' is formed on the first B-staged adhesive pillars 240a'. In still another embodiment as shown in FIG. 9C, the first B-staged adhesive layer 240a is formed on and entirely covers the surface S1 of the first substrate 210, while the second B-staged adhesive layer 240b including the second B-staged adhesive pillars 240b' is formed on the first B-staged adhesive layer 240a.

Figure 10:
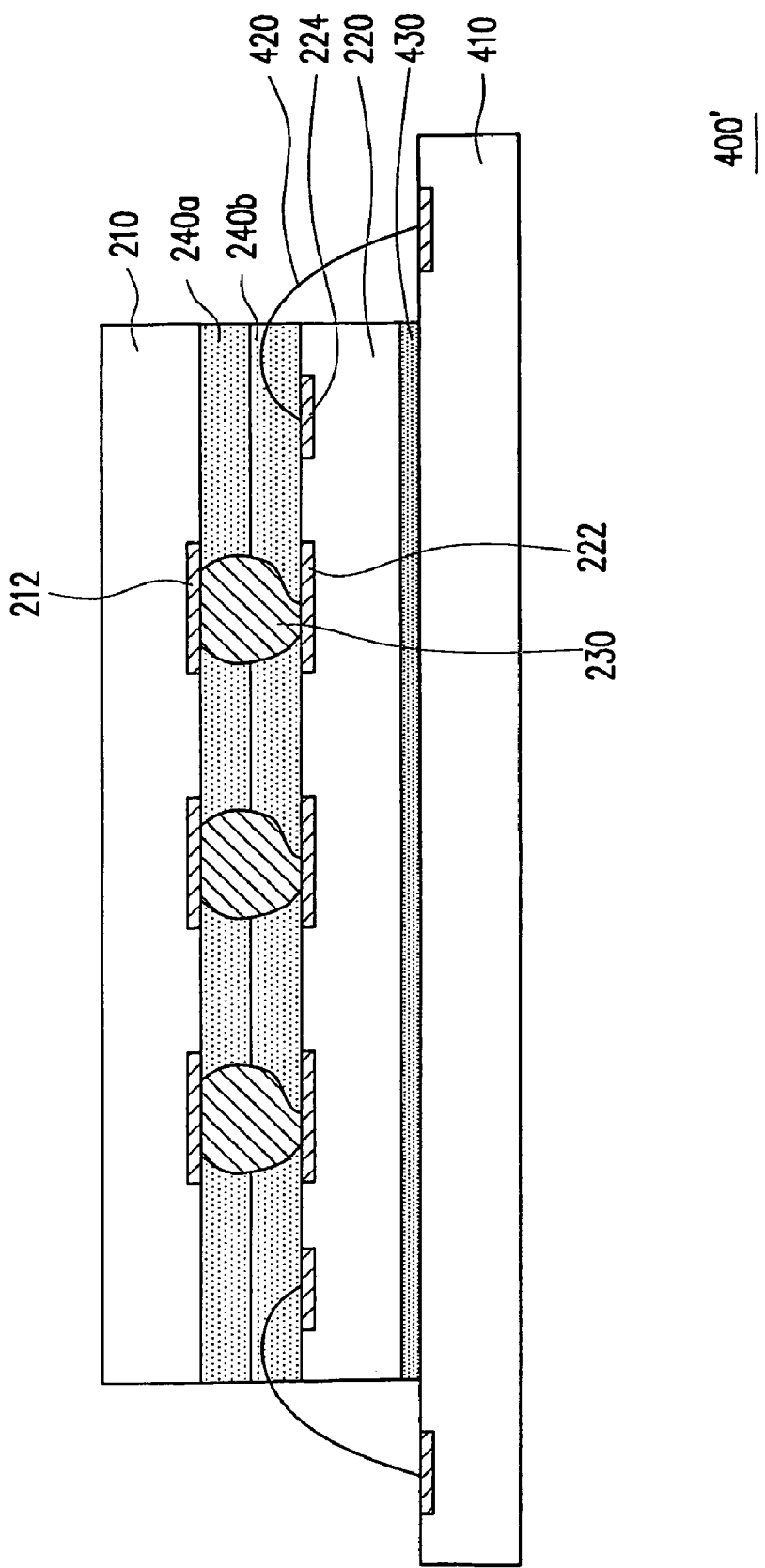
FIG. 10 is another schematic cross-sectional view illustrating a stacked-type chip package structure according to an embodiment of the present invention.

FIG. 10 is another schematic cross-sectional view illustrating a stacked-type chip package structure according to an embodiment of the present invention. Referring to FIG. 10, in the stacked-type chip package structure 400', the inactive surface of the second substrate 220 is bonded to the carrier 410 via an adhesive layer 430 (e.g. epoxy, silver paste, DAF, and so on), and the bonding wires 420 are electrically connected between the wire bonding pads 224 and the carrier 410. Specifically, an end of each bonding wire 420 near the wire bonding pads 224 is encapsulated by the first B-staged adhesive layer 240a when the chip package structure 200' of FIG. 3A or FIG. 3B is bonded to a carrier 410 through the adhesive layer 430. In addition, the first B-staged adhesive layer 240a is disposed on the second B-staged adhesive layer 240b without contacting the bonding wire 420 such that the bonding wire 420 is protected by the second B-staged adhesive layer 240b during the bonding process of the first B-staged adhesive layer 240a and the second B-staged adhesive layer 240b. The detail fabricating process of the stacked-type chip package structure 400' is described as followings.

Figure 11A:
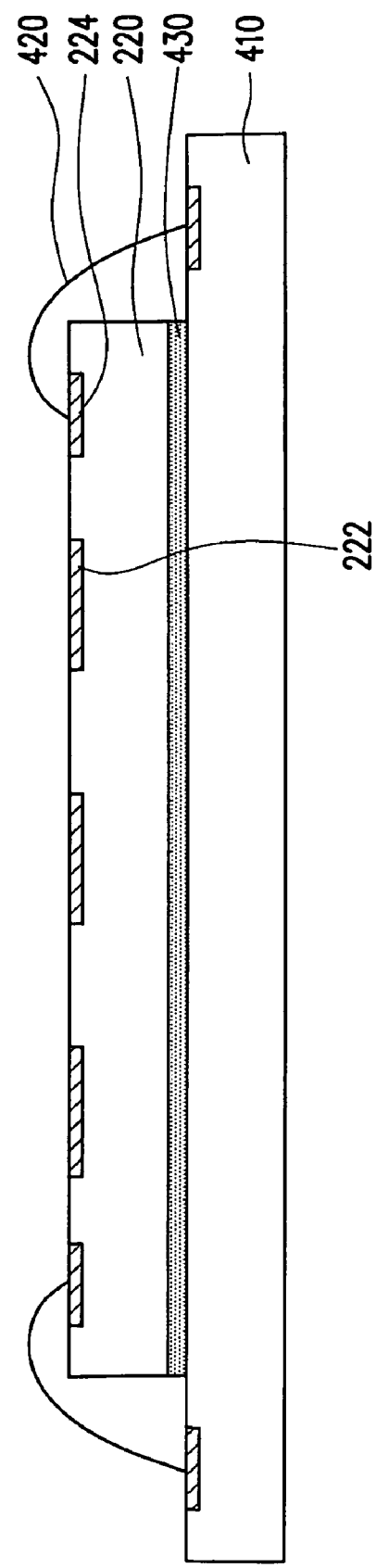
FIG. 11A to FIG. 11C are schematic cross-sectional views illustrating a fabricating process of the stacked-type chip package structure 400' illustrated in FIG. 10.
Figure 11B:
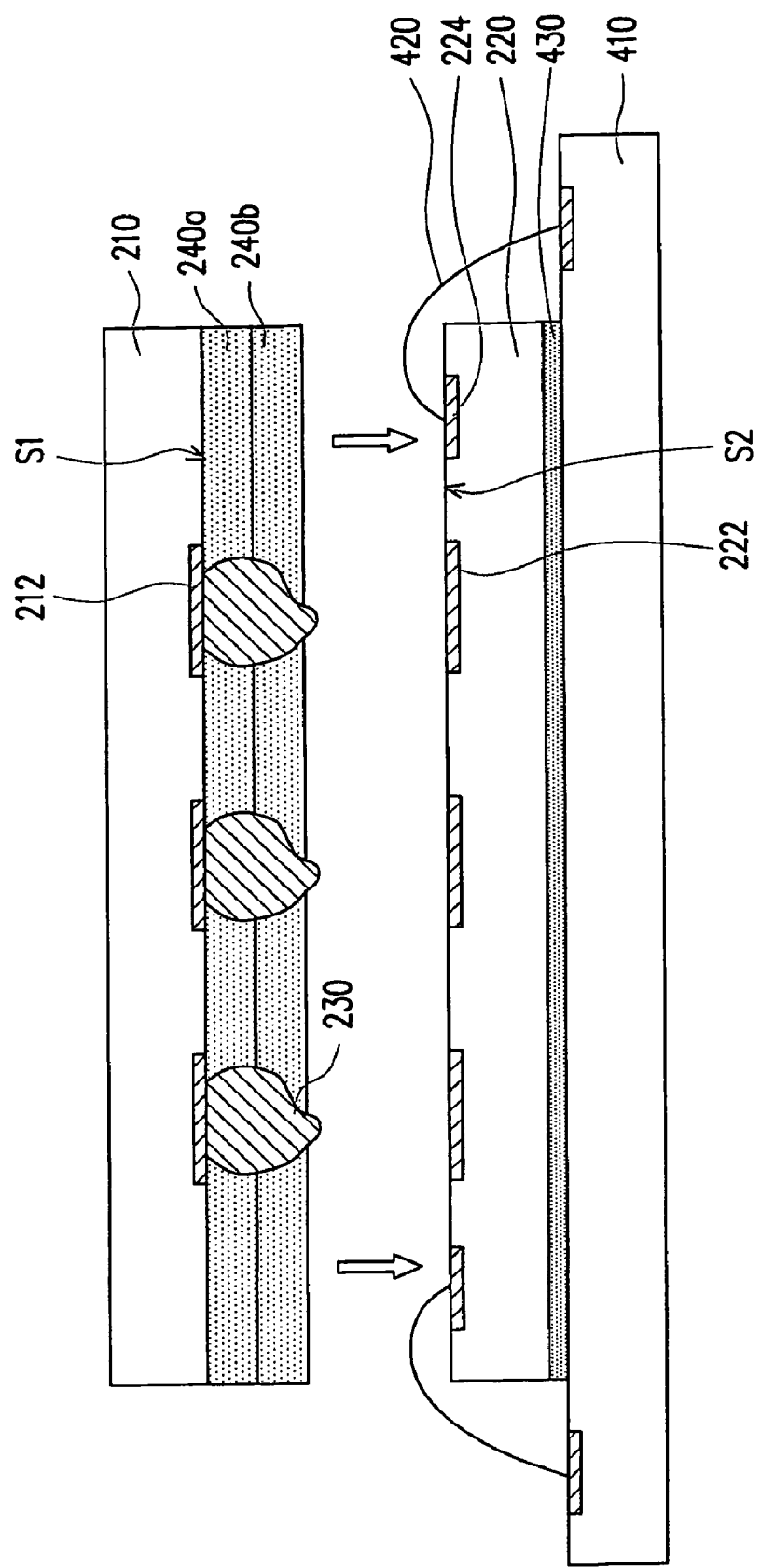
Figure 11C:
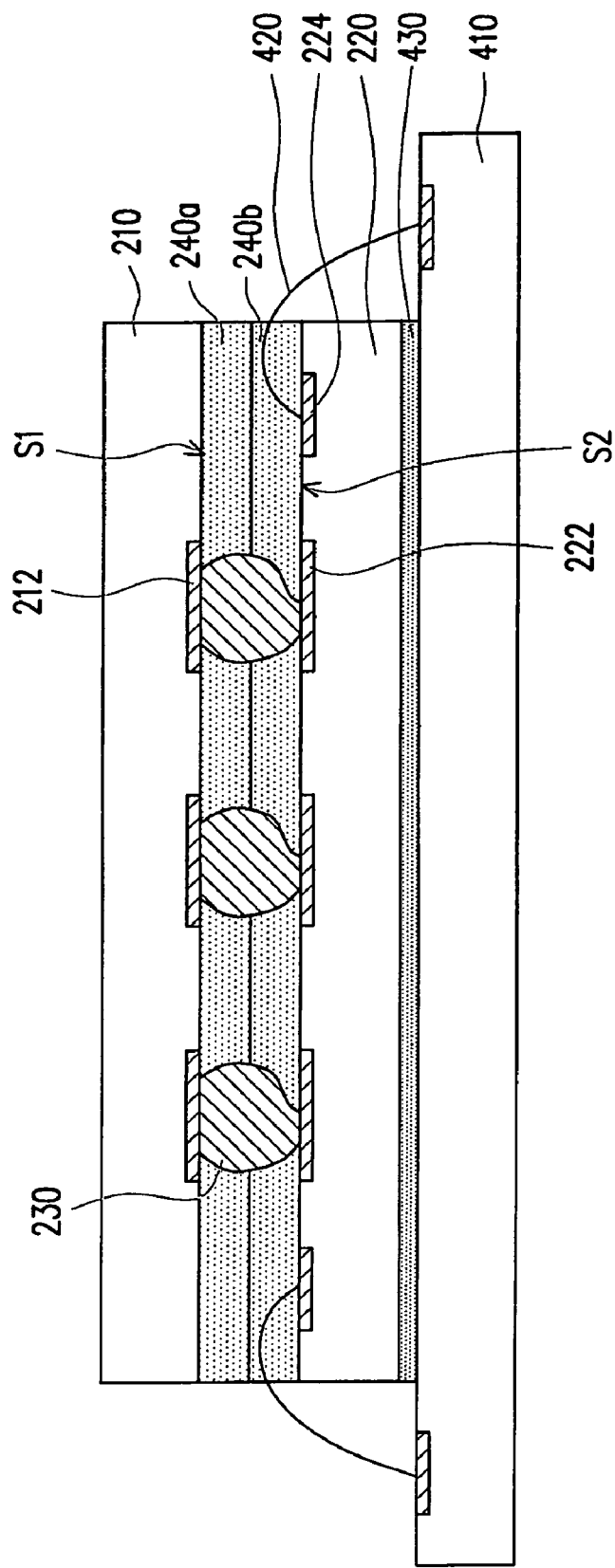

FIG. 11A to FIG. 11C are schematic cross-sectional views illustrating a fabricating process of the stacked-type chip package structure 400' illustrated in FIG. 10. Referring to FIG. 11A, a carrier 410 is provided and a second substrate 220 having a plurality of second bonding pads 222 and a plurality of wire bonding pads 224 is then bonded to the carrier 410 through an adhesive layer 430. After that, a plurality of bonding wires 420 are formed to electrically connect the wire bonding pads 224 and the carrier 410.

Referring to FIG. 11B and FIG. 11C, after the bonding wires 420 are formed, a first substrate 210 having a plurality of first bonding pads 212 and bumps 230 is provided. Then, a first B-staged adhesive layer 240a and a second B-staged adhesive layer 240b are sequentially formed on the surface S1 of the first substrate 210. Ultimately, the first substrate 210 is pressed onto the second substrate 220 such that the bumps 230 encapsulated by the first B-staged adhesive layer 240a and the second B-staged adhesive layer 240b are electrically connect to the second bonding pads 222. It is noted that the bonding wires 420 are capable of piercing the second B-staged adhesive layer 240b because the second B-staged adhesive layer 240b is soft enough. During or after the bonding process (the bonding between the first substrate 210 and the second substrate 220), the first B-staged adhesive layer 240a and the second first B-staged adhesive layer 240b are further cured by heat or UV-ray. If necessary, a post-curing process may be performed after the first substrate 210 and the second substrate 220 are bonded with each other.

As shown in FIG. 11B and FIG. 11C, the first B-staged adhesive layer 240a, the second B-staged adhesive layer 240b and the bumps 230 are all formed on the surface S1 of the first substrate 210. In another embodiment of the present invention, the bumps 230 may formed on the second bonding pads 222, while the first B-staged adhesive layer 240a and the second B-staged adhesive layer 240b are formed on the surface S1 of the first substrate 210.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabricating process of a chip package structure, comprising:
   providing a first substrate having a plurality of first bonding pads;
   providing a second substrate having a plurality of second bonding pads;
   forming a plurality of bumps on the first bonding pads of the first substrate;
   forming a first two-stage adhesive layer on the first substrate or on the second substrate;
   B-stagizing the first two-stage adhesive layer to form a first B-staged adhesive layer;
   forming a second two-stage adhesive layer on the first B-staged adhesive layer after the first B-staged adhesive layer is formed;
   B-stagizing the second two-stage adhesive layer to form a second B-staged adhesive layer on the first B-staged adhesive layer, wherein a glass transition temperature of the first B-staged adhesive layer is greater than or equal to a glass transition temperature of the second B-staged adhesive layer; and
   bonding the first substrate and the second substrate via the first B-staged adhesive layer and the second B-staged adhesive layer such that each of the first bonding pads is respectively electrically connected to one of the second bonding pads via one of the bumps.

2. The fabricating process of a chip package structure according to claim 1, wherein the first substrate and the second substrate are both chips.

3. The fabricating process of a chip package structure according to claim 1, wherein the first substrate is a carrier and the second substrate is a chip.

4. The fabricating process of a chip package structure according to claim 1, wherein the first substrate is a chip and the second substrate is a carrier.

5. The fabricating process of a chip package structure according to claim 1, wherein the bumps are stud bumps formed by wire bonder or plating bumps formed by plating process.

6. The fabricating process of a chip package structure according to claim 1, wherein the first two-stage adhesive layer is formed by screen printing, painting, spraying, spin-coating, or dipping.

7. The fabricating process of a chip package structure according to claim 1, wherein the second two-stage adhesive layer is formed by screen printing, painting, spraying, spin-coating, or dipping.

8. The fabricating process of a chip package structure according to claim 1, wherein a method for forming the first B-staged adhesive layer comprises:
   forming a plurality of first two-stage adhesive pillars on the first bonding pads or on the second bonding pads; and
   B-stagizing the first two-stage adhesive pillars to form a plurality of first B-staged adhesive pillars.

9. The fabricating process of a chip package structure according to claim 8, wherein a method for forming the second B-staged adhesive layer comprises:
   forming a plurality of second two-stage adhesive pillars on the first B-staged adhesive pillars; and
   B-stagizing the second two-stage adhesive pillars to form a plurality of second B-staged adhesive pillars.

10. The fabricating process of a chip package structure according to claim 9, wherein the first B-staged adhesive pillars are conductive.

11. The fabricating process of a chip package structure according to claim 10, wherein the second B-staged adhesive pillars are conductive.

12. The fabricating process of a chip package structure according to claim 10, wherein the second B-staged adhesive pillars are non-conductive.

13. The fabricating process of a chip package structure according to claim 9, wherein the first B-staged adhesive pillars are non-conductive.

14. The fabricating process of a chip package structure according to claim 13, wherein the second B-staged adhesive pillars are conductive.

15. The fabricating process of a chip package structure according to claim 13, wherein the second B-staged adhesive pillars are non-conductive.

16. The fabricating process of a chip package structure according to claim 1, wherein the first B-staged adhesive layer entirely covers the first substrate and the second B-staged adhesive layer comprises a plurality of second B-staged adhesive pillars.

17. The fabricating process of a chip package structure according to claim 1, wherein a method for B-stagizing the first two-stage adhesive layer and the second two-stage adhesive layer comprises heating or UV curing.

18. A fabricating process of a chip package structure, comprising:
   providing a first substrate having a plurality of first bonding pads;
   providing a second substrate having a plurality of second bonding pads;
   forming a plurality of bumps on the first bonding pads of the first substrate;
   forming a first two-stage adhesive layer on the first substrate or on the second substrate;
   B-stagizing the first two-stage adhesive layer to form a first B-staged adhesive layer;
   forming a second two-stage adhesive layer on the first B-staged adhesive layer after the first B-staged adhesive layer is formed;
   B-stagizing the second two-stage adhesive layer to form a second B-staged adhesive layer on the first B-staged adhesive layer, wherein a glass transition temperature of the first B-staged adhesive layer is smaller than a glass transition temperature of the second B-staged adhesive layer; and
   bonding the first substrate and the second substrate via the first B-staged adhesive layer and the second B-staged adhesive layer such that each of the first bonding pads is respectively electrically connected to one of the second bonding pads via one of the bumps.

* * * * *